US006994779B2

United States Patent
(12) United States Patent
Heimann et al.

(10) Patent No.: US 6,994,779 B2
(45) **Date of Patent: *Feb. 7, 2006**

(54) ENERGY ENHANCED PROCESS FOR TREATING A CONDUCTIVE SURFACE AND PRODUCTS FORMED THEREBY

(75) Inventors: Robert L Heimann, Centralia, MO (US); William M. Dalton, Moberly, MO (US); John Hahn, Columbia, MO (US); David M. Price, West Chester, OH (US); Wayne L. Soucie, Columbia, MO (US); Ravi Chandran, New Brunswick, NJ (US)

(73) Assignee: Elisha Holding LLC, Moberly, MO (US)

( * ) Notice: Subject to any disclaimer, the term of this patent is extended or adjusted under 35 U.S.C. 154(b) by 362 days.

This patent is subject to a terminal disclaimer.

(21) Appl. No.: 10/378,983

(22) Filed: Mar. 3, 2003

(65) Prior Publication Data

US 2003/0178317 A1 Sep. 25, 2003

Related U.S. Application Data

(60) Division of application No. 09/814,641, filed on Mar. 22, 2001, now Pat. No. 6,599,643, and a continuation-in-part of application No. 09/775,072, filed on Feb. 1, 2001, now Pat. No. 6,592,738, which is a continuation-in-part of application No. 09/532,982, filed on Mar. 22, 2000, now Pat. No. 6,322,687, which is a continuation-in-part of application No. 09/369,780, filed on Aug. 6, 1999, now Pat. No. 6,153,080, which is a continuation-in-part of application No. 09/122,002, filed on Jul. 24, 1998, now Pat. No. 6,258,243, which is a continuation-in-part of application No. 09/016,250, filed on Jan. 30, 1998, now Pat. No. 6,149,794.

(60) Provisional application No. 60/045,446, filed on May 2, 1997, provisional application No. 60/036,024, filed on Jan. 31, 1997.

(51) Int. Cl.
*C25D 9/08* (2006.01)
*C25D 9/10* (2006.01)

(52) U.S. Cl. ...................... 205/333; 205/199; 205/316; 205/320

(58) Field of Classification Search ................ 205/109, 205/199, 316, 333, 320, 321, 322, 323, 704
See application file for complete search history.

(56) References Cited

U.S. PATENT DOCUMENTS 1,129,320 A 2/1915 Vail et al.

(Continued)

FOREIGN PATENT DOCUMENTS

DE 26 40 419 3/1977

(Continued)

OTHER PUBLICATIONS

Electrodeposition & Characterization of a Corrosion Resistant Zinc-Nickel-Phosphorus Alloy, by A. Krishniyer, M.Ramasubramanian, B.N. Popov & R.E. White Jan. 1999.

(Continued)

*Primary Examiner*—Roy King
*Assistant Examiner*—Harry D. Wilkins, III
(74) *Attorney, Agent, or Firm*—Michael K Boyer

(57) ABSTRACT

The disclosure relates to a process for forming a deposit on the surface of a metallic or conductive surface. The process employs an energy enhanced process to deposit a silicate containing coating or film upon a metallic or conductive surface.

22 Claims, 2 Drawing Sheets

U.S. PATENT DOCUMENTS

| | | | | |
|---|---|---|---|---|
| 1,289,215 | A | 12/1918 | MacGahan | |
| 1,366,305 | A | 1/1921 | Whyte | |
| 1,540,766 | A | 6/1925 | Daniels et al. | |
| 1,744,116 | A | 1/1930 | Hannen et al. | |
| 1,844,670 | A | 2/1932 | Manson | |
| 1,909,365 | A | 5/1933 | Knabner | |
| 1,912,175 | A | 5/1933 | Blough et al. | |
| 1,946,146 | A | 2/1934 | Kiefer et al. | |
| 2,462,763 | A | 2/1949 | Nightingall | |
| 2,475,330 | A | 7/1949 | Nightingall | |
| 2,495,457 | A | 1/1950 | Jacobs | |
| 2,512,563 | A | 6/1950 | DeLong | |
| 2,539,455 | A | 1/1951 | Mazia | |
| 2,641,556 | A | 6/1953 | Robinson | |
| 2,780,591 | A | 2/1957 | Frey | |
| 2,855,328 | A | 10/1958 | Long | |
| 3,224,927 | A | 12/1965 | Brown et al. | |
| 3,301,701 | A | 1/1967 | Baker et al. | |
| 3,444,007 | A | 5/1969 | Maurer et al. | |
| 3,515,600 | A | 6/1970 | Jones et al. | |
| 3,658,662 | A | 4/1972 | Casson, Jr. et al. | |
| 3,663,277 | A | 5/1972 | Koepp et al. | |
| 3,687,740 | A | 8/1972 | Pealstein et al. | |
| 3,796,608 | A | 3/1974 | Pearlman | |
| 3,839,256 | A | 10/1974 | Parkinson | |
| 3,920,468 | A | 11/1975 | Brown et al. | |
| 3,993,548 | A | 11/1976 | Creutz et al. | |
| 4,059,658 | A | 11/1977 | Shoup et al. | |
| 4,082,626 | A | 4/1978 | Hradcovsky | |
| 4,101,692 | A | 7/1978 | Lomasney et al. | |
| 4,105,511 | A | 8/1978 | Nikaido et al. | |
| 4,150,191 | A | 4/1979 | Karki | |
| 4,166,777 | A | 9/1979 | Casson, Jr. et al. | |
| 4,169,916 | A | 10/1979 | Tsutsui et al. | |
| 4,184,926 | A | 1/1980 | Kozak | |
| 4,193,851 | A | 3/1980 | Crawford et al. | |
| 4,222,779 | A | 9/1980 | Bengali et al. | |
| 4,240,838 | A | 12/1980 | Blasko et al. | |
| 4,288,252 | A | 9/1981 | Neely | |
| 4,351,883 | A | 9/1982 | Marcantonio et al. | |
| 4,367,099 | A | 1/1983 | Lash et al. | |
| 4,412,863 | A | 11/1983 | Neely, Jr. | |
| 4,425,166 | A | 1/1984 | Pavlik et al. | |
| 4,427,499 | A | 1/1984 | Hitomi et al. | |
| 4,450,209 | A | 5/1984 | Hara et al. | |
| 4,478,905 | A | 10/1984 | Neely, Jr. | |
| 4,599,371 | A | 7/1986 | Loch et al. | |
| 4,620,904 | A | 11/1986 | Kozak | |
| 4,645,790 | A | 2/1987 | Frey et al. | |
| 4,705,576 | A | 11/1987 | Klos et al. | |
| 4,756,805 | A | 7/1988 | Terada et al. | |
| 4,786,336 | A | 11/1988 | Schoener et al. | |
| 4,792,358 | A | 12/1988 | Kimura et al. | |
| 4,921,552 | A | 5/1990 | Sander et al. | |
| 4,992,116 | A | 2/1991 | Hallman | |
| 5,068,134 | A | 11/1991 | Cole et al. | |
| 5,108,793 | A | 4/1992 | van Ooij et al. | |
| 5,134,039 | A | 7/1992 | Alexander et al. | |
| 5,147,515 | A * | 9/1992 | Hanagata et al. | 204/164 |
| 5,221,371 | A | 6/1993 | Miller | |
| 5,223,106 | A | 6/1993 | Gerace et al. | |
| 5,275,703 | A | 1/1994 | Shih et al. | |
| 5,275,713 | A | 1/1994 | Hradcovsky | |
| 5,283,131 | A | 2/1994 | Mori et al. | |
| 5,338,434 | A | 8/1994 | Ruhl et al. | |
| 5,342,456 | A | 8/1994 | Dolan | |
| 5,346,598 | A | 9/1994 | Riffe et al. | |
| 5,352,277 | A | 10/1994 | Sasaki | |
| 5,352,342 | A | 10/1994 | Riffe | |
| 5,368,655 | A | 11/1994 | Klos | |
| 5,380,374 | A | 1/1995 | Tomlinson | |
| 5,433,976 | A | 7/1995 | van Ooij et al. | |
| 5,478,451 | A | 12/1995 | Riffe | |
| 5,478,655 | A | 12/1995 | Sabata et al. | |
| 5,489,373 | A | 2/1996 | Parthasarathi | |
| 5,498,284 | A | 3/1996 | Neely, Jr. | |
| 5,603,818 | A | 2/1997 | Brent et al. | |
| 5,616,229 | A | 4/1997 | Samsonov et al. | |
| 5,653,823 | A | 8/1997 | McMillen et al. | |
| 5,658,697 | A | 8/1997 | Lin | |
| 5,660,707 | A | 8/1997 | Shastry et al. | |
| 5,660,709 | A | 8/1997 | Bauer et al. | |
| 5,672,390 | A | 9/1997 | Crews, IV et al. | |
| 5,674,371 | A | 10/1997 | Patel | |
| 5,674,790 | A | 10/1997 | Araujo | |
| 5,681,378 | A | 10/1997 | Kerherve | |
| 5,681,658 | A | 10/1997 | Anderson et al. | |
| 5,683,522 | A | 11/1997 | Joesten | |
| 5,683,567 | A | 11/1997 | Shimamune et al. | |
| 5,683,568 | A | 11/1997 | Harris et al. | |
| 5,683,751 | A | 11/1997 | Derule et al. | |
| 5,743,953 | A | 4/1998 | Twardowska et al. | |
| 5,750,085 | A | 5/1998 | Yamada et al. | |
| 5,750,188 | A | 5/1998 | Menu | |
| 5,766,564 | A | 6/1998 | Tijburg et al. | |
| 5,807,428 | A | 9/1998 | Bose et al. | |
| 5,824,366 | A | 10/1998 | Bose et al. | |
| 5,868,819 | A | 2/1999 | Guhde et al. | |
| 5,871,668 | A | 2/1999 | Heimann et al. | |
| 5,876,517 | A | 3/1999 | Jeannier | |
| 5,900,136 | A | 5/1999 | Gotsu et al. | |
| 5,906,971 | A | 5/1999 | Lark | |
| 5,916,516 | A | 6/1999 | Kolb | |
| 6,083,362 | A | 7/2000 | Hryn et al. | |
| 6,083,374 | A | 7/2000 | Kopp | |
| 6,149,794 | A | 11/2000 | Heimann et al. | 205/316 |
| 6,153,080 | A | 11/2000 | Heimann et al. | 205/199 |
| 6,258,243 | B1 | 7/2001 | Heimann et al. | 205/316 |
| 6,322,687 | B1 | 11/2001 | Heimann et al. | 205/316 |
| 6,572,756 | B2 | 6/2003 | Heimann et al. | |
| 6,592,738 | B2 | 7/2003 | Heimann et al. | |
| 6,599,643 | B2 | 7/2003 | Heimann et al. | |

FOREIGN PATENT DOCUMENTS

| | | | |
|---|---|---|---|
| EP | 0 045 017 | | 7/1981 |
| EP | 0 087 288 | | 2/1983 |
| EP | 0 492 306 | A2 | 12/1991 |
| EP | 0 608 107 | A2 | 1/1994 |
| EP | 0 716 163 | A1 | 11/1995 |
| EP | 0 716 163 | B1 | 11/1995 |
| EP | 0 808 883 | A2 | 5/1997 |
| EP | 0985743 | A1 | 3/2000 |
| GB | 498485 | | 2/1939 |
| GB | 2 027 055 | A | 7/1979 |
| JP | 53060937 | | 5/1978 |
| JP | 55091997 | | 11/1980 |
| JP | 57019382 | | 1/1982 |
| JP | 61057654 | | 3/1986 |
| JP | 6016460 | | 8/1987 |
| JP | 1149980 | | 6/1989 |
| JP | 1240674 | | 9/1989 |
| JP | 2125884 | | 5/1990 |
| JP | 03-013593 | A * | 1/1991 |
| JP | 3221275 | | 9/1991 |
| JP | 3260095 | | 11/1991 |
| JP | 5-195252 | | 1/1992 |
| JP | 5-255889 | | 3/1992 |
| JP | 5-287585 | | 4/1992 |
| JP | 04-301096 | A * | 10/1992 |
| JP | 4301096 | | 10/1992 |
| JP | 5070974 | | 3/1993 |
| JP | 5125553 | | 5/1993 |
| JP | 5140761 | | 6/1993 |

| | | |
|---|---|---|
| JP | 5195252 | 8/1993 |
| JP | 5255889 | 10/1993 |
| JP | 5279869 | 10/1993 |
| JP | 5287585 | 11/1993 |
| JP | 7-179949 | 12/1993 |
| JP | 7179949 | 7/1995 |
| JP | 10310722 | 11/1998 |
| JP | 11209891 | 8/1999 |
| RU | 2063486 | 10/1996 |
| WO | WO 94/18362 | 8/1994 |
| WO | WO 97/40208 | 10/1997 |
| WO | WO 98/33856 | 8/1998 |
| WO | WO 98/33960 | 8/1998 |
| WO | WO 9703231 | 1/1999 |
| WO | WO 99/31303 | 6/1999 |
| WO | WO 01/12883 | 2/2001 |
| WO | WO 01/71067 | 9/2001 |

OTHER PUBLICATIONS

Ellipsometric and Raman Spectroscopic Study of Thermally Formed Films on Titnium, E. Hristova and Li Arsov, B.N. Popov and R.E. White J. Electrochem Soc., vol. 144, No. 7, Jul. 1997 The Elect rochemical Society, Inc.

Galvanostatic Pulse and Pulse Reverse Plating of Zinc-Nickel Alloys form Sulfate Electrolytes on a Rotating Disc Electrode—B.N. Popov, M. Ramasubramanian, S.N. Popova, R.E. White and K-M Yin, J. Chem. Soc., Faraday Trans vol. 92 (4021-4027), 1996, no month avail.

Galavanostatic Pulse and Pulse Reverse Plating of Nickel-Iron Alloys from Electrolytes Containing Organic Compounds on a Rotating Disk Electrode—B.N. Popov, Ken-Ming Yin, and R.E. White, J. Electrochem. Soc. 140(5), May 1993.

Silicate Species in High pH Solution Molybdate, Whose Silica Concentration is Determined by Colorimetry—Miho Tanakaa, Kazuya Takahashib—The Tokyo Univ. ov Fisheries, Konan, Minato-ku, Tokyo 1088477, Japan. The Institute of Physical and Chemical Research (RIKEN), Hirosawa, Wako, Saitama 3510198, Japan, Oct. 2, 2000. Oct. 30, 2000, Analytica Chimica Acta pp. 117-123.

Silicon—29 NMR Studies of Aqueous Silicate Solutions, 2. Transverse 29 Si Relaxa and the Kinetics and Mechanism of Silicate Polymerization, Stephen D. Kinrade and Thomas W. Swaddle, Nov. 25, 1987, Inorg. Chem. 1988, 27.4259-426.4, pp. 4259-4264.

Soaking Up Rays—A primutive marine creature has natural-glass fibers that hint at high tech—Peter Weiss (Silica Skeletons)—Aug. 4, 2001, Science News, vol. 160, pp. 77-79.

A cathodically-deposited mineral coating for replacement of Cr(VI) and CR (iii) reatments of zinc—Nancy Heimann, at AESF/EPA Conference, Feb. 1, 2001.

Development and commercialization of non-chrome electrolytic surface treatment for metallic surfaces—Wayne L. Soucie, Nancy G. Heimann, Robert L. Heimann, Information Exchange Seven Spa Resort, Champion, PA, Sep. 26, 2000.

Modification and characterization of MineralizationSurface for Corrosion Protection—John J. Hahn, Nancy G. McGowan and Robert L. Heimann, Tery L. Barr, No date.

Zero chrome electrolytic surface treatment for metallic surfaces—Part 1—Bob Heimann, Bill Dalton & Wayne Soucie, Dr. Ravi Chandran. No date.

B. Cabot, A. Foissy—Reversal of the surface charge of a mineral powder: application to electrophoretic deposition of silica for anti corrosion coatings—Journal of Materials Science 33 (1998) 3945-3952 No month.

A.E. Chmel—Effect of Zn2+—on the Correlation Radius in the Na20-Zn0-Si02 System Inorganic Materials vol. 32, No. 3, 1996, pp. 321-322 No month.

Ing. J. Kohnen—Long Life Corrosion Protection with Unorganic Zincates Verfahrenst chnik (Mainz), 1968; 2(5): 217-20 No month.

Hogrefe, Andre Rene: Czank, Michael—Synthetic dipotassium sinc disilicate—Mineralogisches Inst., Univ.Kiel, Kiel, Germany, Acta Crystallogr., Sect C: Cryst. Struct. Commun. (1995), C51(9), 1728-30. CODEN: ACSCEE ISSN: 0108-2701 Journal written in English. CAN 123:271293 AN 1995:840577 CAPLUS No month.

Kharitonov, Yu. Ya; Khomutov, N.E. and Akol zin, A.P. (Mosk. Khim-Tekhnol. Inst., Moscow, USSR—Study of the reaction of iron hydroxides and oxides with sodium silicate and silicic acid solutions, Zashet, Met, 1978; 14(1):89-90, CODEN;ZAMEA9;ISSN:0044-1856 No month.

Pretreatment and Surface Preparation, Ande, K. Matsushima, Y. -Journal Name: Bosie Kanri (Rust Prev. Control) 31. (7)—Jul. 1987, pp. 214-221, ISSN—0520-6340. Language Japanese and English translation.

Anomalous Codeposition of Fe-Ni Alloys and Fe-Ni-Si02 Anomalous Codepositon of Fe-Ni-Si02 Composites under Potentiostatic Conditions—Experimental Study and Mathematical Model—M. Ramasubramanian, S.N. Popov, and R.E. White—J. Electrochem Soc., vol. 143, No. 2, Jul. 1996, The Electrochemical Society, Inc.

ASM Handbook, 1994, pp. 4, 7, 8 and 10. No month avail.

Brown et al.—Silicates as Cleaners in the Production of Tin Plate II, Influence of Batch Anneal, Plating, Oct. 1971.

Characterization of Hydrogen Permeation through Zinc-Nickel Alloys under Corroding Conditions: Mathematical Model and Experimental Study—M. Ramansubra-manian, B.N. Popov, and R.E. White—J. Electrochem. Soc., vol. 145, No. 6, Jun. 1998.

Characterization of Hydrogen Permeation Through a Corrosion -Resistant Zinc-Nickel-Phosphorous Alloy, A. Durairajan, A. Krishniyer, B.S. Haran, R.E. White and B.N. Popov—Corrosion—vol. 56, No. 3, Mar. 2000.

Development of a New Electrodeposition Process for Plating of Zn-Ni-X (X=Cd, P), Alloys, Permeation Characteristics of Zn-Ni-Cd Ternary Alloys—A. Durairajan, Bala S. Haran, Ralph E. White, Branko N. Popov—Journal of the Electrochemical Society, 147 (5) S-2 Proof pp. (2000) No month avail.

ISFEC 92 Conference, Sep. 1992 Watson, et al.—The Electrodeposition of Zinc Chromium Alloys and the Formation of Conversion Coatings Without Use of Chromate Solutions. Mass transport effects on the electrodeposition of iron nickel alloys at the presence of additives—K.M. Yin, J.H. Wei, J.R. Fu, B.N. Popov, S.N. Popova, R.E. White—Journal of Applied Electrochemistry 25 (1995) 543-555. No month avail.

The Chemistry of Silica—Solubility; Polymerization, Colloid and Surface Properties, and Biochemistry—Ralph K. ller—John Wiley & Sons—Copyright 1979, pp. 83-85, 161-163 No month avail.

Soluble Silicates Their Properties and Uses—vol. 2; Technology—James C. Vail. D Sc-Copyright 1952, pp. 152-231, and 284. No month avail.

Use of Underpotential Deposition of Zinc to Mitigate Hydrogen Absorption into Monel K500—G. Zheng., B.N. Popov, and R.E. White, Journal Electrochem. Soc. 141(5), May 1994.

The Depolymerization of Silica in Sodium Hydroxide Solutions—SA. Greenberg Laboratory for Physical and Inorganic Chemistry, Leiden, Hollan, Mar. 11, 1957 vol. 61 pp. 960-965.
Effect of pH on Polymerization of Silicic Acid—Katsumi Goto, Faculty of Engineering, Hokkaido University, Sappor. Japan—Mar. 13, 1956 Jul. 1956, pp. 1007-1008.
Effects of Amide Additives on Polymerizationof Silica Under Acidic Conditions—Tatsuro Horiuchi, Government Industrial Research Institute, Nagoya, 1-1, Hirate-cho, Kita-ku, Kita-ku, Nagoya 462 Japan—May 11, 1991, revised received Feb. 5, 1992—Journal of Non-Crystalline Solids.
Kinetics of Silica Polymerization and Deposition from Dilute Solutions between 5 and 180 degree C—H.P. Rothbaum and A.G. Rohde, Chemistry Division, Dept. of Scientific and Industrial Research, Lower Hutt, New Zealand, Dec. 13, 1978, accepted Jan. 25, 1979-13 Journal: of Colloid and Interface Science, vol. 71, No. 3, Oct. 1, 1979, pp. 533-559.
The Polymerization of Monosilicic Acid—G.B. Alexander—Oct. 7, 1953 Grasselli Chemicals Dept., Experimental Station, E.I. DuPont de Nemours & Co., Inc. po 2094-2096, vol. 76.
The Polymerization of Silicic Acid—Sidney A. Greenberg and David Sinclair, Johns-Manville Research Center, Manville, NJ—Nov. 20, 1954, May 1955, pp. 435-440.
The Preparation of Monosilicic Acid—G.B. Alexander—Jan. 16, 1953, Jun. 20, 1953, pp. 2887-2888.
The Reaction of Low Molecular Weight Silicic Acids with Molybdic Acid, G.B. Alexander, Jun. 11, 1953, pp. 5655-5657.
Development of a New Electrodeposition Process for Plting of Zn-Ni-X (X=Cd, P), Alloys—A. Durairajan, B. D. Haran, R. E. White, B.N. Popov—Journal of t he Electrochemical Society, 147(2) (2000) No month avail.

* cited by examiner

ENERGY ENHANCED PROCESS FOR TREATING A CONDUCTIVE SURFACE AND PRODUCTS FORMED THEREBY

The subject matter herein is a divisional of U.S. patent application Ser. No. 09/814,641, filed on Mar. 22, 2001 now U.S Pat. No 6,599,643 and is a cip of Ser. No. 09/775,072, filed on Feb. 01, 2001 now U.S Pat No. 6,592,738 that is a continuation in part of Ser. No. 09/532,982, filed on Mar. 22, 2000 now U.S Pat No. 6,322,687 that is a continuation in part of Ser. No. 09/369,780, filed on Aug. 06, 1999 (now U.S. Pat. No. 6,153,080) that is a continuation in part of Ser. No. 09/122,002, filed on Jul. 24, 1998 now U.S. Pat. No. 6,258,243 that is a continuation in part of Ser. No. 09/016, 250, filed on Jan. 30, 1998 (now U.S. Pat. No. 6,149,794) in the names of Robert L. Heimann et al. and entitled "An Electrolytic Process For Forming A Mineral"; the entire disclosures of which are hereby incorporated by reference. The subject matter of this invention claims benefit under 35 U.S.C. 111(a), 35 U.S.C. 119(e) and 35 U.S.C. 120 of U.S. Provisional Patent Application Ser. No. 60/036,024, filed on Jan. 31, 1997 and Ser. No. 60/045,446, filed on May 2, 1997 and entitled "Non-Equilibrium Enhanced Mineral Deposition". The disclosure of the previously filed provisional patent applications is hereby incorporated by reference.

FIELD OF THE INVENTION

The instant invention relates to a process for forming a deposit on the surface of a metallic or conductive surface. The process employs an electrolytic process to deposit, for example, a mineral containing coating or film upon a metallic, metal containing or an electrically conductive surface.

BACKGROUND OF THE INVENTION

Silicates have been used in electrocleaning operations to clean steel, tin, among other surfaces. Electrocleaning is typically employed as a cleaning step prior to an electroplating operation. Using "Silicates As Cleaners In The Production of Tinplate" is described by L. J. Brown in February 1966 edition of *Plating;* hereby incorporated by reference.

Processes for electrolytically forming a protective layer or film by using an anodic method are disclosed by U.S. Pat. No. 3,658,662 (Casson, Jr. et al.), and United Kingdom Patent No. 498,485; both of which are hereby incorporated by reference.

U.S. Pat. No. 5,352,342 to Riffe, which issued on Oct. 4, 1994 and is entitled "Method And Apparatus For Preventing Corrosion Of Metal Structures" that describes using electromotive forces upon a zinc solvent containing paint; hereby incorporated by reference.

SUMMARY OF THE INVENTION

The instant invention solves problems associated with conventional practices by providing a cathodic method for forming a protective layer upon a metallic or metal containing substrate (e.g., the protective layer can range from about 100 to about 2,500 Angstroms thick). The cathodic method is normally conducted by contacting (e.g., immersing) a substrate having an electrically conductive surface into a silicate containing bath or medium wherein, a current is introduced to (e.g., passed through) the bath and the substrate is the cathode.

The inventive process can form a mineral layer comprising an amorphous matrix surrounding or incorporating metal silicate crystals upon the substrate. The characteristics of the mineral layer are described in greater detail in the copending and commonly assigned patent applications listed below.

An electrically conductive surface that is treated (e.g., forming the mineral layer) by the inventive process can possess improved corrosion resistance, increased electrical resistance, heat resistance, flexibility, resistance to stress crack corrosion, adhesion to topcoats, among other properties. The treated surface imparts greater corrosion resistance (e.g., ASTM B-117), among other beneficial properties, than conventional tri-valent or hexa-valent chromate systems. The inventive process can provide a zinc-plate article having an ASTM B-117 resistance to white rust of at least about 72 hours (and normally greater than about 96 hours), and resistance to red rust of at least about 168 (and normally greater than about 400 hours). The corrosion resistance can be improved by using a rinse and/or applying at least one topcoating.

The inventive process is a marked improvement over conventional methods by obviating the need for solvents or solvent containing systems to form a corrosion resistant layer, e.g., a mineral layer. In contrast, to conventional methods the inventive process can be substantially solvent free. By "substantially solvent free" it is meant that less than about 5 wt. %, and normally less than about 1 wt. % volatile organic compounds (V.O.C.s) are present in the electrolytic environment.

The inventive process is also a marked improvement over conventional methods by reducing, if not eliminating, chromate and/or phosphate containing compounds (and issues attendant with using these compounds such as waste disposal, worker exposure, among other undesirable environmental impacts). While the inventive process can be employed to enhance chromated or phosphated surfaces, the inventive process can replace these surfaces with a more environmentally desirable surface. The inventive process, therefore, can be "substantially chromate free" and "substantially phosphate free" and in turn produce articles that are also substantially chromate (hexavalent and trivalent) free and substantially phosphate free. The inventive process can also be substantially free of heavy metals such as chromium, lead, cadmium, cobalt, barium, among others. By substantially chromate free, substantially phosphate free and substantially heavy metal free it is meant that less than 5 wt. % and normally about 0 wt. % chromates, phosphates and/or heavy metals are present in a process for producing an article or the resultant article. In addition to obviating chromate containing processes, the inventive method forms a layer having greater heat resistance, flexibility, among other properties, than conventional chromate coatings. The improved heat resistance broadens the range of processes that can be performed subsequent to forming the inventive layer, e.g., heat cured topcoatings, stamping/shaping, riveting, among other processes.

In contrast to conventional electrocleaning processes, the instant invention employs silicates in a cathodic process for forming a mineral layer upon the substrate. Conventional electro-cleaning processes sought to avoid formation of oxide containing products such as greenalite whereas the instant invention relates to a method for forming silicate containing products, e.g., a mineral.

CROSS REFERENCE TO RELATED PATENTS AND PATENT APPLICATIONS

The subject matter of the instant invention is related to copending and commonly assigned WIPO Patent Application Publication No. WO 98/33960, Non-Provisional U.S. patent application Ser. Nos. 08/850,323 (Now U.S. Pat. No. 6,165,257); Ser. no. 08/850,586 (Now U.S. Pat. No. 6,143, 420); and Ser. No. 09/016,853 (now allowed), filed respectively on May 2, 1997 and Jan. 30, 1998, and Ser. No. 08/791,337 (now U.S. Pat. No 5,938,976), filed on Jan. 31, 1997, in the names of Robert L. Heimann et al., as a continuation in part of Ser. No. 08/634,215 (filed on Apr. 18, 1996) in the names of Robert L. Heimann et al., and entitled "Corrosion Resistant Buffer System for Metal Products", which is a continuation in part of Non-Provisional U.S patent application Ser. No. 08/476,271 (filed on Jun. 7, 1995) in the names of Heimann et al., and corresponding to WIPO Patent Application Publication No. WO 96/12770, which in turn is a continuation in part of Non-Provisional U.S. patent application Ser. No. 08/327,438 (filed on Oct. 21, 1994), now U.S. Pat. No. 5,714,093.

The subject matter of this invention is related to Non-Provisional patent application Ser. No. 09/016,849, filed on Jan. 30, 1998 and entitled "Corrosion Protective Coatings". The subject matter of this invention is also related to Non-Provisional patent application Ser. No. 09/016,462, filed on Jan. 30, 1998 and entitled "Aqueous Gel Compositions and Use Thereof" (now U.S. Pat. No. 6,033,495). The disclosure of the previously identified patents, patent applications and publications is hereby incorporated by reference.

DETAILED DESCRIPTION

Figure 1:
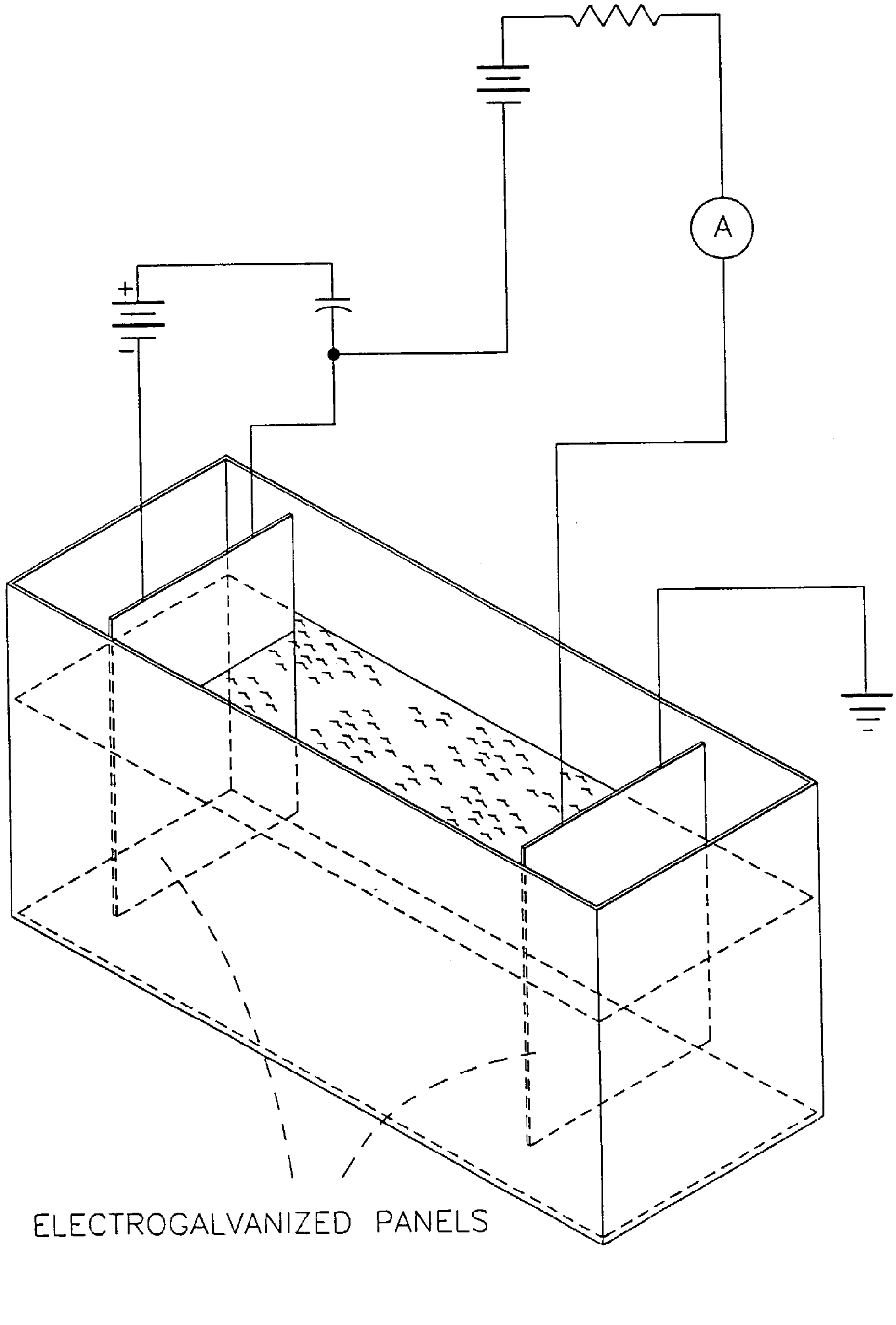
FIG. 1 is a schematic drawing of the circuit and apparatus which can be employed for practicing an aspect of the invention.

The instant invention relates to a process for depositing or forming a beneficial surface (e.g., a mineral containing coating or film) upon a metallic or an electrically conductive surface. The process employs a silicate medium, e.g., containing soluble mineral components or precursors thereof, and utilizes an electrically enhanced method to treat an electrically conductive surface (e.g., to obtain a mineral coating or film upon a metallic or conductive surface). By "mineral containing coating", "mineralized film" or "mineral" it is meant to refer to a relatively thin coating or film which is formed upon a metal or conductive surface wherein at least a portion of the coating or film comprises at least one metal containing mineral, e.g., an amorphous phase or matrix surrounding or incorporating crystals comprising a zinc disilicate. Mineral and Mineral Containing are defined in the previously identified Copending and Commonly Assigned Patents and Patent Applications; incorporated by reference. By "electrolytic" or "electrodeposition" or "electrically enhanced", it is meant to refer to an environment created by introducing or passing an electrical current through a silicate containing medium while in contact with an electrically conductive substrate (or having an electrically conductive surface) and wherein the substrate functions as the cathode. By "metal containing", "metal", or "metallic", it is meant to refer to sheets, shaped articles, fibers, rods, particles, continuous lengths such as coil and wire, metallized surfaces, among other configurations that are based upon at least one metal and alloys including a metal having a naturally occurring, or chemically, mechanically or thermally modified surface. Typically a naturally occurring surface upon a metal will comprise a thin film or layer comprising at least one oxide, hydroxides, carbonates, sulfates, chlorides, among others. The naturally occurring surface can be removed or modified by using the inventive process.

The electrolytic environment can be established in any suitable manner including immersing the substrate, applying a silicate containing coating upon the substrate and thereafter applying an electrical current, among others. The preferred method for establishing the environment will be determined by the size of the substrate, electrodeposition time, applied voltage, among other parameters known in the electrodeposition art. The effectiveness of the electrolytic environment can be enhanced by supplying energy in the form of ultrasonic, laser, ultraviolet light, RF, IR, among others. The inventive process can be operated on a batch or continuous basis.

The silicate containing medium can be a fluid bath, gel, spray, among other methods for contacting the substrate with the silicate medium. Examples of the silicate medium comprise a bath containing at least one silicate, a gel comprising at least one silicate and a thickener, among others. The medium can comprise a bath comprising at least one of potassium silicate, calcium silicate, lithium silicate, sodium silicate, compounds releasing silicate moieties or species, among other silicates. The bath can comprise any suitable polar carrier such as water, alcohol, ethers, among others. Normally, the bath comprises sodium silicate and de-ionized water and optionally at least one dopant. Typically, the at least one dopant is water soluble or dispersible within an aqueous medium.

The silicate containing medium typically has a basic pH. Normally, the pH will range from greater than about 9 to about 13 and typically, about 10 to about 11. The medium is normally aqueous and can comprise at least one water soluble or dispersible silicate in an amount from greater than 0 to about 40 wt. %, usually, about 3 to 15 wt. % and typically about 10 wt. %. The silicate medium can further comprise at least one water dispersible or soluble dopant. The silicate containing medium is also normally substantially free of heavy metals, chromates and/or phosphates.

The electrolytic environment can be preceded by and/or followed with conventional post and/or pre-treatments known in this art such as cleaning or rinsing, e.g., immersion/spray within the treatment, sonic cleaning, double counter-current cascading flow; alkali or acid treatments, among other treatments. By employing a suitable post-treatment the solubility, corrosion resistance (e.g., reduced white rust formation when treating zinc containing surfaces), sealer and/or topcoat adhesion, among other properties of surface of the substrate formed by the inventive method can be improved. If desired, the post-treated surface can be sealed, rinsed and/or topcoated, e.g., silane, epoxy, latex, fluoropolymer, acrylic, titanates, zirconates, carbonates, among other coatings.

In one aspect of the invention, a pre-treatment comprises exposing the substrate to be treated to at least one of an acid, oxidizer, among other compounds. The pre-treatment can be employed for removing excess oxides or scale, equipotentialize the surface for subsequent mineralization treatments, convert the surface into a mineral precursor, among other benefits. Conventional methods for acid cleaning metal surfaces are described in ASM, Vol. 5, Surface Engineering (1994), and U.S. Pat. No. 6,096,650; hereby incorporated by reference.

In one aspect of the invention, the post treatment comprises exposing the substrate to a source of at least one carbonate or precursors thereof. Examples of carbonate comprise at least one member from the group of gaseous carbon dioxide, lithium carbonate, lithium bicarbonate, sodium carbonate, sodium bicarbonate, potassium carbonate, potassium bicarbonate, rubidium carbonate, rubidium bicarbonate, rubidium acid carbonate, cesium carbonate, ammonium carbonate, ammonium bicarbonate, ammonium carbamate and ammonium zirconyl carbonate. Normally, the carbonate source will be water soluble. In the case of a carbonate precursor such as carbon dioxide, the precursor can be passed through a liquid (including the silicate containing medium) and the substrate immersed in the liquid. One specific example of a suitable postreatment is disclosed in U.S. Pat. No. 2,462,763; hereby incorporated by reference. Another specific example of a post treatment comprises exposing a treated surface to a solution obtained by diluting ammonium zirconyl carbonate (1:4) in distilled water (e.g., Bacote® 20 supplied by Magnesium Elektron Corp). If desired, this post treated surface can be topcoated (e.g., aqueous or water borne topcoats).

In another aspect of the invention, the post treatment comprises heating the surface. Typically the amount of heating is sufficient to densify the inventive surface without adversely affecting the physical properties of the underlying metal substrate. Heating can occur under atmospheric conditions, within a nitrogen containing environment, among other gases. If desired, prior to heating the inventive surface can be contacted with a solution containing a material that reacts with the surface at elevated temperatures.

In another aspect of the invention, the post treatment comprises exposing the substrate to a source comprising at least one acid source or precursors thereof. Examples of suitable acid sources comprise at least one member chosen from the group of phosphoric acid, hydrochloric acid, molybdic acid, silicic acid, acetic acid, citric acid, nitric acid, hydroxyl substituted carboxylic acid, glycolic acid, lactic acid, malic acid, tartaric acid, among other acid sources effective at improving at least one property of the treated metal surface. The pH of the acid post treatment can be modified by employing at least one member selected from the group consisting of ammonium citrate dibasic (available commercially as Citrosol® #503 and Multiprep®), fluoride salts such as ammonium bifluoride, fluoboric acid, fluorosilicic acid, among others. The acid post treatment can serve to activate the surface thereby improving the effectiveness of rinses, sealers and/or topcoatings (e.g., surface activation prior to contacting with a sealer can improve cohesion between the surface and the sealer thereby improving the corrosion resistance of the treated substrate). Normally, the acid source will be water soluble and employed in amounts of up to about 5 wt. % and typically, about 1 to about 2 wt. %.

In another aspect of the invention, the post treatment comprises contacting a surface treated by the inventive process with a rinse. By “rinse” it is meant that an article or a treated surface is sprayed, dipped, immersed or other wise exposed to the rinse in order to affect the properties of the treated surface. For example, a surface treated by the inventive process is immersed in a bath comprising at least one rinse. In some cases, the rinse can interact or react with at least a portion of the treated surface. Further the rinsed surfaced can be modified by multiple rinses, heating, topcoating, adding dyes, lubricants and waxes, among other processes. Examples of suitable compounds for use in rinses comprise at least one member selected from the group of titanates, titanium chloride, tin chloride, zirconates, zirconium acetate, zirconium oxychloride, fluorides such as calcium fluoride, tin fluoride, titanium fluoride, zirconium fluoride; coppurous compounds, ammonium fluorosilicate, metal treated silicas (e.g., Ludox®), nitrates such as aluminum nitrate; sulphates such as magnesium sulphate, sodium sulphate, zinc sulphate, and copper sulphate; lithium compounds such as lithium acetate, lithium bicarbonate, lithium citrate, lithium metaborate, lithium vanadate, lithium tungstate, among others. The rinse can further comprise at least one organic compound such as vinyl acrylics, fluorosurfactancts, polyethylene wax, among others. Examples of commercially available rinses comprise at least one member selected from the group of Aqualac® (urethane containing aqueous solution), W86®, W87®, B37®, T01®, E10®, among others (a heat cured coating supplied by the Magni® Group), JS2030S (sodium silicate containing rinse supplied by MacDermid Incorporated), JS2040I (a molybdenum containing rinse also supplied by MacDermid Incorporated), EnSeal® C-23 (an acrylic based coating supplied by Enthone), EnSeal® C-26, Enthone® C-40 (a pigmented coating supplied Enthone), Microseal®, Paraclene® 99 (a chromate containing rinse), EcoTri® (a silicate/polymer rinse), MCI Plus OS (supplied by Metal Coatings International), among others. One specific rinse comprises water, water dispersible urethane, and at least one silicate, e.g., refer to commonly assigned U.S. Pat. No. 5,871,668; hereby incorporated by reference. While the rinse can be employed neat, normally the rinse will be dissolved, diluted or dispersed within another medium such as water, organic solvents, among others. While the amount of rinse employed depends upon the desired results, normally the rinse comprises about 0.1 wt % to about 50 wt. % of the rinse medium. The rinse can be employed as multiple applications and, if desired, heated.

The metal surface refers to a metal article or body as well as a non-metallic or an electrically conductive member having an adhered metal or conductive layer. While any suitable surface can be treated by the inventive process, examples of suitable metal surfaces comprise at least one member selected from the group consisting of galvanized surfaces, sheradized surfaces, zinc, iron, steel, brass, copper, nickel, tin, aluminum, lead, cadmium, magnesium, alloys thereof such as zinc-nickel alloys, tin-zinc alloys, zinc-cobalt alloys, zinc-iron alloys, among others. If desired, the mineral layer can be formed on a non-conductive substrate having at least one surface coated with an electrically conductive material, e.g., a metallized polymeric article or sheet, ceramic materials coated or encapsulated within a metal, among others. Examples of metallized polymer comprise at least one member selected from the group of polycarbonate, acrylonitrile butadiene styrene (ABS), rubber, silicone, phenolic, nylon, PVC, polyimide, melamine, polyethylene, polyproplyene, acrylic, fluorocarbon, polysulfone, polyphenyene, polyacetate, polystyrene, epoxy, among others. Conductive surfaces can also include carbon or graphite as well as conductive polymers (polyaniline for example).

The metal surface can possess a wide range of sizes and configurations, e.g., fibers, coils, sheets including perforated acoustic panels, chopped wires, drawn wires or wire strand/rope, rods, couplers (e.g., hydraulic hose couplings), fibers, particles, fasteners (including industrial and residential hardware), brackets, nuts, bolts, rivets, washers, cooling fins, stamped articles, powdered metal articles, among others. The limiting characteristic of the inventive process to treat a metal surface is dependent upon the ability of the electrical current/energy to contact the metal surface. That is, similar to conventional electroplating technologies, a mineral surface may be difficult to apply upon a metal surface defining hollow areas or voids. This difficulty can be addressed by using a conformal anode.

The inventive process creates a flexible surface that can survive secondary processes, e.g., metal deformation for riveting, sweging, crimping, among other processes, and continue to provide corrosion protection. Such is in contrast to typical corrosion inhibitors such as chromates that tend to crack when the underlying surface is shaped. If desired, the surface formed by the inventive process can be topcoated (e.g, with a heat cured epoxy), prior to secondary processing. Articles treated in accordance with the inventive process, topcoated and exposed to a secondary process retain their desirable corrosion resistance, coating adhesion, component functionality, among properties.

The inventive process provides a surface (e.g., mineral coating) that can enhance the surface characteristics of the metal or conductive surface such as resistance to corrosion, protect carbon (fibers for example) from oxidation, stress crack corrosion (e.g., stainless steel), hardness, thermal resistance, improve bonding strength in composite materials, provide dielectric layers, improve corrosion resistance of printed circuit/wiring boards and decorative metal finishes, and reduce the conductivity of conductive polymer surfaces including application in sandwich type materials.

The mineral coating can also affect the electrical and magnetic properties of the surface. That is, the mineral coating can impart electrical resistance or insulative properties to the treated surface. By having an electrically non-conductive surface, articles having the inventive layer can reduce, if not eliminate, electro-galvanic corrosion in fixtures wherein current flow is associated with corrosion, e.g., bridges, pipelines, among other articles.

In one aspect of the invention, the inventive process is employed for improving the cracking and oxidation resistance of aluminum, copper or lead containing substrates. For example, lead, which is used extensively in battery production, is prone to corrosion that in turn causes cracking, e.g., inter-granular corrosion. The inventive process can be employed for promoting grain growth of aluminum, copper and lead substrates as well as reducing the impact of surface flaws. Without wishing to be bound by any theory or explanation, it is believed that the lattice structure of the mineral layer formed in accordance with the inventive process on these 3 types of substrates can be a partially polymerized silicate. These lattices can incorporate a disilicate structure, or a chain silicate such as a pyroxene. A partially polymerized silicate lattice offers structural rigidity without being brittle. In order to achieve a stable partially polymerized lattice, metal cations would preferably occupy the lattice to provide charge stability. Aluminum has the unique ability to occupy either the octahedral site or the tetrahedral site in place of silicon. The +3 valence of aluminum would require additional metal cations to replace the +4 valance of silicon. In the. case of lead application, additional cation can comprise +2 lead ion.

In an aspect of the invention, an electrogalvanized panel, e.g., a zinc surface, is coated electrolytically by being placed into an aqueous sodium silicate solution. After being placed into the silicate solution, a mineral coating or film containing silicates is deposited by using relatively low voltage potential (e.g., about 1 to about 24 v depending upon the desired current density) and low current. The current density can range from about 0.7 A/in2 to about 0.1 A/in2 at 12 volt constant. Normally, hydrogen is evolved at the workpiece/cathode and oxygen at the anode.

In one aspect of the invention, the workpiece is initially employed as an anode and then electrically switched (or pulsed) to the cathode. By pulsing the voltage, the workpiece can be pre-treated in-situ (prior to interaction with the electrolytic medium). Pulsing can also increase the thickness of the film or layer formed upon the workpiece. If desired, dopants (e.g., cations) can be present in the electrolyte and deposited upon the surface by pulsing either prior to or following mineralization.

In another aspect of the invention, the metal surface, e.g., zinc, aluminum, magnesium, steel, lead and alloys thereof; has an optional pretreatment. By "pretreated" it is meant to refer to a batch or continuous process for conditioning the metal surface to clean it and condition the surface to facilitate acceptance of the mineral or silicate containing coating e.g., the inventive process can be employed as a step in a continuous process for producing corrosion resistant coil steel. The particular pretreatment will be a function of composition of the metal surface and desired functionality of the mineral containing coating/film to be formed on the surface. Examples of suitable pre-treatments comprise at least one of cleaning, e.g., sonic cleaning, activating, heating, degreasing, pickling, deoxidizing, shot glass bead blasting, sand blasting and rinsing. One suitable pretreatment process for steel comprises:

1) 2 minute immersion in a 3:1 dilution of Metal Prep 79 (Parker Amchem), 2) two deionized water rinses, 3) 10 second immersion in a pH 14 sodium hydroxide solution, 4) remove excess solution and allow to air dry, 5) 5 minute immersion in a 50% hydrogen peroxide solution, 6) remove excess solution and allow to air dry.

In another aspect of the invention, the metal surface is pretreated by anodically cleaning the surface. Such cleaning can be accomplished by immersing the work piece or substrate into a medium comprising silicates, hydroxides, phosphates, carbonates, among other cleaning agents. By using the work piece as the anode in a DC cell and maintaining a current of about 10 A/ft2 to about 150 A/ft2, the process can generate oxygen gas. The oxygen gas agitates the surface of the workpiece while oxidizing the substrate's surface. The surface can also be agitated mechanically by using conventional vibrating equipment. If desired, the amount of oxygen or other gas present during formation of the mineral layer can be increased by physically introducing such gas, e.g., bubbling, pumping, among other means for adding gases.

In a further pre-treatment aspect of the invention, the work piece is exposed to the inventive silicate medium as an anode thereby cleaning the work piece (e.g., removing naturally occurring compounds). The work piece can then converted to the cathode and processed in accordance with the inventive methods.

In a further aspect of the invention, the silicate medium is modified to include at least one dopant material. The amount of dopant can vary depending upon the properties of the dopant and desired results. Typically, the amount of dopant will range from about 0.001 wt. % to about 5 wt. % (or greater so long as the electrolyte is not adversely affected. Examples of suitable dopants comprise at least one member selected from the group of water soluble salts, oxides and precursors of tungsten, molybdenum, chromium, titanium (titatantes), zircon, vanadium, phosphorus, aluminum (aluminates), iron (e.g., iron chloride), boron (borates), bismuth, gallium, tellurium, germanium, antimony, niobium (also known as columbium), magnesium and manganese, sulfur, zirconium (zirconates) mixtures thereof, among others, and usually, salts and oxides of aluminum and iron. The dopant can comprise at least one of molybdenic acid, fluorotitanic acid and salts thereof such as titanium hydrofluoride, ammonium fluorotitanate, ammonium fluorosilicate and sodium fluorotitanate; fluorozirconic acid and salts thereof such as $H_2ZrF_6$, $(NH_4)_2ZrF_6$ and $Na_2ZrF_6$; among others. Alternatively, dopants can comprise at least one substantially water insoluble material such as electropheritic transportable polymers, PTFE, boron nitride, silicon carbide, silicon nitride, aluminum nitride, titanium carbide, diamond, titanium diboride, tungsten carbide, metal oxides such as cerium oxide, powdered metals and metallic precursors such as zinc, among others.

The aforementioned dopants that can be employed for enhancing the mineral layer formation rate, modifying the chemistry and/or physical properties of the resultant layer, as a diluent for the electrolyte or silicate containing medium, among others. Examples of such dopants are iron salts (ferrous chloride, sulfate, nitrate), aluminum fluoride, fluorosilicates (e.g., K2SiF6), fluoroaluminates (e.g., potassium fluoroaluminate such as K2A1F5-H2O), mixtures thereof, among other sources of metals and halogens. The dopant materials can be introduced to the metal or conductive surface in pretreatment steps prior to electrodeposition, in post treatment steps following electrodeposition (e.g., rinse), and/or by alternating electrolytic contacts in solutions of dopants and solutions of silicates if the silicates will not form a stable solution with the dopants, e.g., one or more water soluble dopants. The presence of dopants in the electrolyte solution can be, employed to form tailored surfaces upon the metal or conductive surface, e.g., an aqueous sodium silicate solution containing aluminate can be employed to form a layer comprising oxides of silicon and aluminum. That is, at least one dopant (e.g., zinc) can be co-deposited along with at least one siliceous species (e.g., a mineral) upon the substrate.

Moreover, the aforementioned rinses can be modified by incorporating at least one dopant. The dopant can employed for interacting or reacting with the treated surface. If desired, the dopant can be dispersed in a suitable medium such as water and employed as a rinse.

The silicate medium can be modified by adding water/polar carrier dispersible or soluble polymers, and in some cases the electro-deposition solution itself can be in the form of a flowable gel consistency having a predetermined viscosity. If utilized, the amount of polymer or water dispersible materials normally ranges from about 0 wt. % to about 10 wt. %. Examples of polymers or water dispersible materials that can be employed in the silicate medium comprise at least one member selected from the group of acrylic copolymers (supplied commercially as Carbopol®), hydroxyethyl cellulose, clays such as bentonite, fumed silica, solutions comprising sodium silicate (supplied commercially by MacDermid as JS2030S), among others. A suitable composition can be obtained in an aqueous composition comprising about 3 wt % N-grade Sodium Silicate Solution (PQ Corp), optionally about 0.5 wt % Carbopol EZ-2 (B F Goodrich), about 5 to about 10 wt. % fumed silica, mixtures thereof, among others. Further, the aqueous silicate solution can be filled with a water dispersible polymer such as polyurethane to electro-deposit a mineral-polymer composite coating. The characteristics of the electro-deposition solution can also be modified or tailored by using an anode material as a source of ions which can be available for codeposition with the mineral anions and/or one or more dopants. The dopants can be useful for building additional thickness of the electrodeposited mineral layer.

The silicate medium can also be modified by adding at least one diluent or electrolyte. Examples of suitable diluent comprise at least one member selected from the group of sodium sulphate, surfactants, de-foamers, colorants/dyes, among others. The diluent (e.g., sodium sulfate) can be employed for improving the electrical conductivity of bath, reducing the affects of contaminants entering the silicate medium, reducing bath foam, among others. When the diluent is employed as a defoamer, the amount normally comprises less than about 5 wt. % of the electrolyte, e.g., about 1 to about 2 wt. %. A diluent for affecting the electrical conductivity of the bath or electrolyte is normally in employed in an amount of about 0 wt. % to about 20 wt. %.

The following sets forth the parameters which may be employed for tailoring the inventive process to obtain a desirable mineral containing coating:

1. Voltage
2. Current Density
3. Apparatus or Cell Design
4. Deposition Time
5. Programmed current and voltage variations during processing
6. Concentration of the silicate solution
7. Type and concentration of anions in solution
8. Type and concentration of cations in solution
9. Composition/surface area of the anode
10. Composition/surface area of the cathode
11. Temperature
11. Pressure
12. Type and Concentration of Surface Active Agents The specific ranges of the parameters above depend upon the substrate to be treated, and the intended composition to be deposited. Normally, the temperature of the electrolyte bath ranges from about 25 to about 95 C. (e.g., about 75 C.), the voltage from about 6 to 24 volts, an electrolyte solution concentration from about 5 to about 15 wt. % silicate, the current density ranges from about 0.025 A/in2 and greater than 0.60 A/in2 (e.g., about 180 to about 200 mA/cm2 and normally about 192 mA/cm2), contact time with the electrolyte from about 10 seconds to about 50 minutes and normally about 1 to about 15 minutes and anode to cathode surface area ratio of about 0.5:1 to about 2:1. Items 1, 2, 7, and 8 can be especially effective in tailoring the chemical and physical characteristics of the coating. That is, items 1 and 2 can affect the deposition time and coating thickness whereas items 7 and 8 can be employed for introducing dopants that impart desirable chemical characteristics to the coating. The differing types of anions and cations can comprise at least one member selected from the group consisting of Group I metals, Group II metals, transition and rare earth metal oxides, oxyanions such as molybdate, phosphate, titanate, boron nitride, silicon carbide, aluminum nitride, silicon nitride, mixtures thereof, among others.

The typical process conditions will provide an environment wherein hydrogen is evolved at the cathode and oxygen at the anode. Without wishing to be bound by any theory or explanation, it is believed that the hydrogen evolution provides a relatively high pH at the surface to be treated. It is also believed that the oxygen reduced or deprived environment along with a high pH can cause an interaction or a reaction at the surface of the substrate being treated. It is further believed that zinc can function as a barrier to hydrogen thereby reducing, if not eliminating, hydrogen embrittlement being caused by operating the inventive process.

The inventive process can be modified by employing apparatus and methods conventionally associated with electroplating processes. Examples of such methods include pulse plating, horizontal plating systems, barrel, rack, adding electrolyte modifiers to the silicate containing medium, employing membranes within the bath, among other apparatus and methods.

The inventive process can be modified by varying the composition of the anode. Examples of suitable anodes comprise graphite, platinum, zinc, iron, steel, iridium oxide, beryllium oxide, tantalum, niobium, titanium, nickel, Monel® alloys, pallidium, alloys thereof, among others. The anode can comprise a first material clad onto a second, e.g., platinum plated titanium or platinum clad niobium mesh. The anode can possess any suitable configuration, e.g., mesh adjacent to a barrel plating system. In some cases, the anode (e.g., iron or nickel) can release ions into the electrolyte bath that can become incorporated within the mineral layer. Normally, ppm concentrations of anode ions are sufficient to affect the mineral layer composition. If a dimensionally stable anode is desired, then platinum clad or plated niobium can be employed. In the event a dimensionally stable anode requires cleaning, in most cases the anode can be cleaned with sodium hydroxide solutions. Anode cleaning can be enhanced by using heat and/or electrical current.

Figure 2:
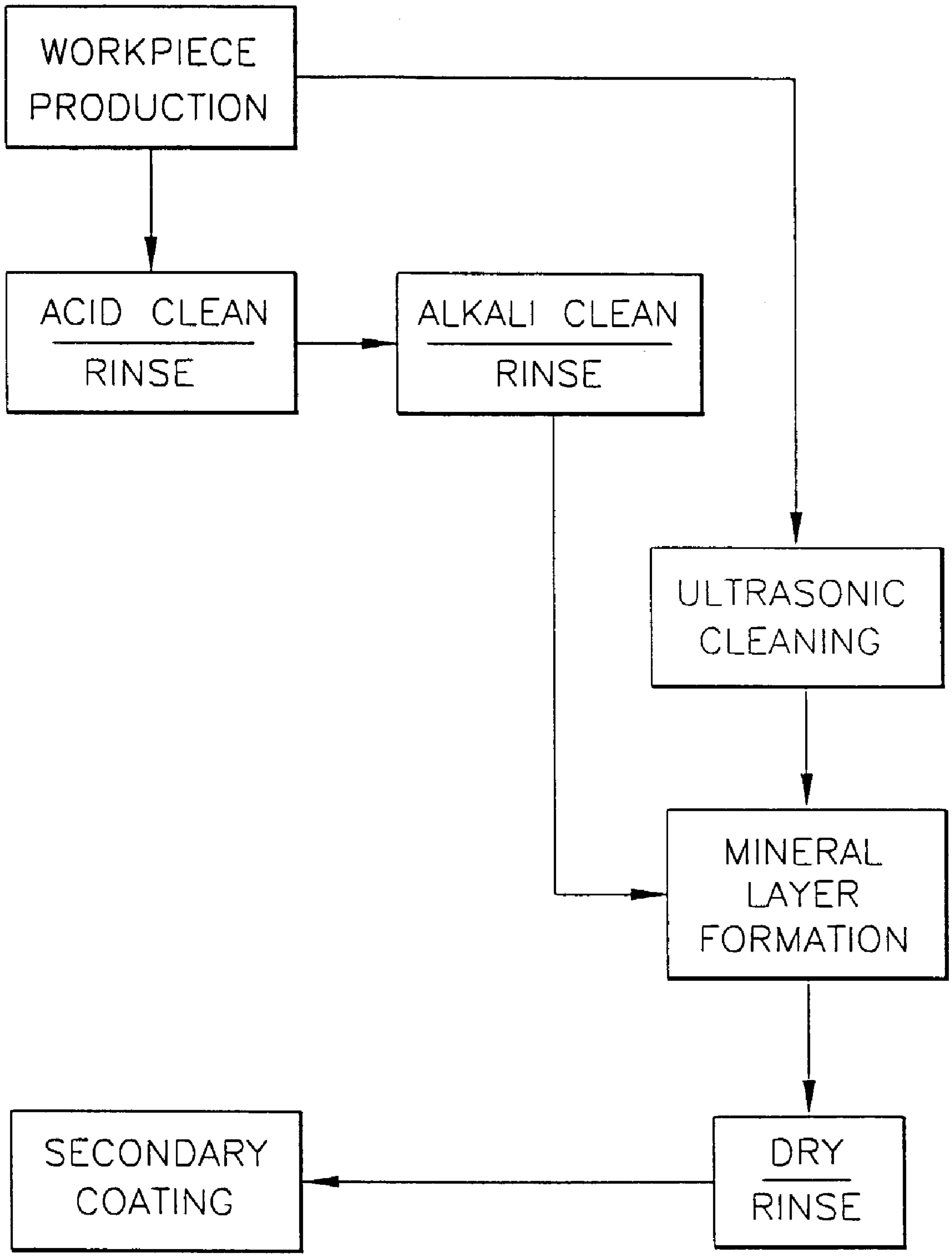
FIG. 2 is a schematic drawing of one process that employs the inventive electrolytic method.

The inventive process can be practiced in any suitable apparatus. Examples of suitable apparatus comprise rack and barrel plating, brush plating, horizontal plating, continuous lengths, among other apparatus conventionally used in electroplating metals. Certain aspects of the inventive process are better understood by referring to the drawings. Referring now to FIG. 2, FIG. 2 illustrates a schematic drawing of one process that employs one aspect of the inventive electrolytic method. The process illustrated in FIG. 2 can be operated in a batch or continuous process. The articles having a metal surface to be treated (or workpiece), if desired, can be cleaned by an acid such as hydrochloric or citric acid, rinsed with water, and rinsed with an alkali such as sodium hydroxide, rinsed again with water. The cleaning and rinsing can be repeated as necessary. If desired the acid/alkali cleaning can be replaced with a conventional sonic cleaning apparatus. The workpiece is then subjected to the inventive electrolytic method thereby forming a mineral coating upon at least a portion of the workpiece surface. The workpiece is removed from the electrolytic environment, dried and rinsed with water, e.g, a layer comprising, for example, silica and/or sodium carbonate can be removed by rinsing.

Whether or not the workpiece is rinsed, the inventive process can impart improved corrosion resistance without using chromates (hex or trivalent). When a zinc surface is treated by the inventive process, the thickness (or total amount) of zinc can be reduced while achieving equivalent, if not improved, corrosion resistance. For example, when exposing a steel article to a zinc plating environment for a period of about 2.5 to about 30 minutes and then to the inventive process for a period of about 2.5 to about 30 minutes white rust first occurs from about 24 hours to about 120 hours (when tested in accordance with ASTM B-117), and red rust failure occurs from about 100 to about 800 hours. As a result, the inventive process permits tailoring the amount of zinc to a desired level of corrosion resistance. If desired, the corrosion resistance can be improved further by applying at least one topcoating.

The inventive process also imparts improved torque tension properties in comparison to conventional chromate processes (hex or trivalent). Wilson-Garner M10 bolts were coated with conventional zinc and yellow hexavalent chromate, and treated in accordance with the inventive process. The torque tension of these bolts was tested in accordance with test protocol USCAR-11 at forces from about 20,000 to about 42,300 Newtons. The standard deviation for the peak torque for the conventional zinc/yellow chromate treated bolts was about 5.57 Nm with a three-sigma range of about 33.4, and about 2.56 Nm with a three-sigma range of 15.4 for bolts treated in accordance with the inventive process.

Depending upon the intended usage of the workpiece treated by the inventive method, the workpiece can be coated with a secondary coating or layer. Alternatively, the treated workpiece can be rinsed (as described above) and then coated with a secondary coating or layer. Examples of such secondary coatings or layers comprise one or more members of acrylic coatings (e.g., IRILAC®), silanes including those having amine, acrylic and aliphatic epoxy functional groups, latex, urethane, epoxies, silicones, alkyds, phenoxy resins (powdered and liquid forms), radiation curable coatings (e.g., UV curable coatings), lacquer, shellac, linseed oil, among others. Secondary coatings can be solvent or water borne systems. The secondary coatings can be applied by using any suitable conventional method such as immersing, dip-spin, spraying, among other methods. The secondary coatings can be cured by any suitable method such as UV exposure, heating, allowed to dry under ambient conditions, among other methods. An example of UV curable coating is described in U.S. Pat. Nos. 6,174,932 and 6,057,382; hereby incorporated by reference. Normally, the surface formed by the inventive process will be rinsed, e.g., with at least one of deionized water, silane or a carbonate, prior to applying a topcoat. The secondary coatings can be employed for imparting a wide range of properties such as improved corrosion resistance to the underlying mineral layer, reduce torque tension, a temporary coating for shipping the treated workpiece, decorative finish, static dissipation, electronic shielding, hydrogen and/or atomic oxygen barrier, among other utilities. The mineral coated workpiece, with or without the secondary coating, can be used as a finished product or a component to fabricate another article.

The thickness of the rinse, sealer and/or topcoat can range from about 0.00001 inch to about 0.025 inch. The selected thickness varies depending upon the end use of the coated article. In the case of articles having close dimensional tolerances, e.g., threaded fasteners, normally the thickness is less than about 0.00005 inch.

Without wishing to be bound by any theory or explanation a silica containing layer can be formed upon the mineral. The silica containing layer can be chemically or physically modified and employed as an intermediate or tie-layer. The tie-layer can be used to enhance bonding to paints, coatings, metals, glass, among other materials contacting the tie-layer. This can be accomplished by binding to the top silica containing layer one or more materials which contain alkyl, fluorine, vinyl, epoxy including two-part epoxy and powder paint systems, silane, hydroxy, amino, mixtures thereof, among other functionalities reactive to silica or silicon hydroxide. Alternatively, the silica containing layer can be removed by using conventional cleaning methods, e.g, rinsing with de-ionized water. The silica containing tie-layer can be relatively thin in comparison to the mineral layer 100–500 angstroms compared to the total thickness of the mineral which can be 1500–2500 angstroms thick. If desired, the silica containing layer can be chemically and/or physically modified by employing the previously described post-treatments, e.g., exposure to at least one carbonate or acid source. The post-treated surface can then be contacted with at least one of the aforementioned secondary coatings, e.g, a heat cured epoxy.

In another aspect, the mineral without or without the aforementioned silica layer functions as an intermediate or tie-layer for one or more secondary coatings, e.g., silane containing secondary coatings. Examples of such secondary coatings and methods that can be complimentary to the instant invention are described in U.S. Pat. Nos. 5,759,629; 5,750,197; 5,539,031; 5,498,481; 5,478,655; 5,455,080; and 5,433,976. The disclosure of each of these U.S. Patents is hereby incorporated by reference. For example, improved corrosion resistance of a metal substrate can be achieved by using a secondary coating comprising at least one suitable silane in combination with a mineralized surface. Examples of suitable silanes comprise at least one members selected from the group consisting of tetra-ortho-ethyl-silicate (TEOS), bis-1,2-(triethoxysilyl) ethane (BSTE), vinyl silane or aminopropyl silane, epoxy silanes, alkoxysilanes, among other organo functional silanes. The silane can bond with the mineralized surface and then the silane can cure thereby providing a protective top coat, or a surface for receiving an outer coating or layer. In some cases, it is desirable to sequentially apply the silanes. For example, a steel substrate, e.g., a fastener, can be treated to form a mineral layer, allowed to dry, rinsed in deionized water, coated with a 5% BSTE solution, coated again with a 5% vinyl silane solution, and powder coated with a thermoset epoxy paint (Corvel 10-1002 by Morton) at a thickness of 2 mils. The steel substrate was scribed using a carbide tip and exposed to ASTM B117 salt spray for 500 hours. After the exposure, the substrates were removed and rinsed and allowed to dry for 1 hour. Using a spatula, the scribes were scraped, removing any paint due to undercutting, and the remaining gaps were measured. The tested substrates showed no measurable gap beside the scribe.

The inventive process forms a surface that has improved adhesion to outer coatings or layers, e.g., secondary coatings. Examples of suitable outer coatings comprise at least one member selected from the group consisting of acrylics, epoxies, e-coats, latex, urethanes, silanes (e.g., TEOS, MEOS, among others), fluoropolymers, alkyds, silicones, polyesters, oils, gels, grease, among others. An example of a suitable epoxy comprises a coating supplied by The Magni® Group as B17 or B18 top coats, e.g, a galvanized article that has been treated in accordance with the inventive method and contacted with at least one silane and/or ammonium zirconium carbonate and top coated with a heat cured epoxy (Magni® B18) thereby providing a chromate free corrosion resistant article. By selecting appropriate rinses, secondary and outer coatings for application upon the mineral, a corrosion resistant article can be obtained without chromating or phosphating. Such a selection can also reduce usage of zinc to galvanize iron containing surfaces, e.g., a steel surface is mineralized, coated with a silane containing coating and with an outer coating comprising an epoxy.

Without wishing to be bound by any theory or explanation, it is believed that the inventive process forms a surface that can release or provide water or related moieties. These moieties can participate in a hydrolysis or condensation reaction that can occur when an overlying rinse, seal or topcoating cures. Such participation improves the cohesive bond strength between the surface and overlying cured coating.

The surface formed by the inventive process can also be employed as an intermediate or tie-layer for glass coatings, glass to metal seals, hermetic sealing, among other applications wherein it is desirable to have a joint or bond between a metallic substrate and a glass layer or article. The inventive surface can serve to receive molten glass (e.g., borosilicate, aluminosilicate, phosphate, among other glasses), while protecting the underlying metallic substrate and forming a seal.

The inventive process can provide a surface that improves adhesion between a treated substrate and an adhesive. Examples of adhesives comprise at least one member selected from the group consisting of hot melts such as at least one member selected from the group of polyamides, polyimides, butyls, acrylic modified compounds, maleic anhydride modified ethyl vinyl acetates, maleic anhydride modified polyethylenes, hydroxyl terminated ethyl vinyl acetates, carboxyl terminated ethyl vinyl acetates, acid terpolymer ethyl vinyl acetates, ethylene acrylates, single phase systems such as dicyanimide cure epoxies, polyamide cure systems, lewis acid cure systems, polysulfides, moisture cure urethanes, two phase systems such as epoxies, activated acrylates polysulfides, polyurethanes, among others. Two metal substrates having surfaces treated in accordance with the inventive process can be joined together by using an adhesive. Alternatively one substrate having the inventive surface can be adhered to another material, e.g., joining treated metals to plastics, ceramics, glass, among other surfaces. In one specific aspect, the substrate comprises an automotive hem joint wherein the adhesive is located within the hem.

The improved cohesive and adhesive characteristics between a surface formed by the inventive process and polymeric materials can permit forming acoustical and mechanical dampeners, e.g., constraint layer dampers such as described in U.S. Pat. No. 5,678,826 hereby incorporated by reference, motor mounts, bridge/building bearings, HVAC silencers, highway/airport sound barriers, among other articles. The ability to improve the bond between vistoelastomeric materials sandwiched between metal panels in dampers reduces sound transmission, improves formability of such panels, reduces process variability, among other improvements. The metal panels can comprise any suitable metal such as 304 steel, stainless steel, aluminum, cold rolled steel, zinc alloys, hot dipped zinc or electrogalvanized, among other materials. Examples of polymers that can be bonded to the inventive surface and in turn to an underlying metal substrate comprise any suitable material such as neoprene, EPDM, SBR, EPDM, among others. The inventive surface can also provide elastomer to metal bonds described in U.S. Pat. No. 5,942,333; hereby incorporated by reference.

The inventive process can employ dopants, rinses and/or sealers for providing a surface having improved thermal and wear resistance. Such surfaces can be employed in gears (e.g., transmission), powdered metal articles, exhaust systems including manifolds, metal flooring/grates, heating elements, among other applications wherein it is desirable to improve the resistance of metallic surfaces.

In another aspect of the invention, the inventive process can be used to produce a surface that reduces, if not eliminates, molten metal adhesion (e.g., by reducing intermetallic formation). Without wishing to be bound by any theory or explanation, it is believed that the inventive process provides an ablative and/or a reactive film or coating upon an article or a member that can interact or react with molten metal thereby reducing adhesion to the bulk article. For example, the inventive process can provide an iron or a zinc silicate film or layer upon a substrate in order to shield or isolate the substrate from molten metal contact (e.g., molten aluminum or magnesium). The effectiveness of the film or layer can be improved by applying an additional coating comprising silica (e.g., to function as an ablative when exposed to molten metal). The ability to prevent molten metal adhesion is desirable when die casting aluminum or magnesium over zinc cores, die casting aluminum for electronic components, among other uses. The molten metal adhesion can be reduced further by applying one of the aforementioned topcoatings, e.g. Magni® B18, acrylics, polyesters, among others. The topcoatings can be modified (e.g., to be more heat resistant) by adding a heat resistant material such as colloidal silica (e.g., Ludox®).

While the above description places particular emphasis upon forming a mineral containing layer upon a metal surface, the inventive process can be combined with or replace conventional metal pre or post treatment and/or finishing practices. Conventional post coating baking methods can be employed for modifying the physical characteristics of the mineral layer, remove water and/or hydrogen, among other modifications. The inventive mineral layer can be employed to protect a metal finish from corrosion thereby replacing conventional phosphating process, e.g., in the case of automotive metal finishing the inventive process could be utilized instead of phosphates and chromates and prior to coating application e.g., E-Coat. Further, the aforementioned aqueous mineral solution can be replaced with an aqueous polyurethane based solution containing soluble silicates and employed as a replacement for the so-called automotive E-coating and/or powder painting process. The mineral forming process can be employed for imparting enhanced corrosion resistance to electronic components, e.g., such as the electric motor shafts as demonstrated by Examples 10–11. The inventive process can also be employed in a virtually unlimited array of end-uses such as in conventional plating operations as well as being adaptable to field service. For example, the inventive mineral containing coating can be employed to fabricate corrosion resistant metal products that conventionally utilize zinc as a protective coating, e.g., automotive bodies and components, grain silos, bridges, among many other end-uses. Moreover, depending upon the dopants and concentration thereof present in the mineral deposition solution, the inventive process can produce microelectronic films, e.g., on metal or conductive surfaces in order to impart enhanced electrical/magnetic (e.g., EMI shielding, reduced electrical connector fretting, reduce corrosion. caused by dissimilar metal contact, among others), and corrosion resistance, or to resist ultraviolet light and monotomic oxygen containing environments such as outer space.

The following Examples are provided to illustrate certain aspects of the invention and it is understood that such an Example does not limit the scope of the invention as defined in the appended claims. The x-ray photoelectron spectroscopy (ESCA) data in the following Examples demonstrate the presence of a unique metal disilicate species within the mineralized layer, e.g., ESCA measures the binding energy of the photoelectrons of the atoms present to determine bonding characteristics.

EXAMPLE 1

The following apparatus and materials were employed in this Example:

Standard Electrogalvanized Test Panels, ACT Laboratories
10% (by weight) N-grade Sodium Silicate solution
12 Volt EverReady battery
1.5 Volt Ray-O-Vac Heavy Duty Dry Cell Battery
Triplett RMS Digital Multimeter
30 μF Capacitor
29.8 kΩ Resistor A schematic of the circuit and apparatus which were employed for practicing the Example are illustrated in FIG. 1. Referring now to FIG. 1, the aforementioned test panels were contacted with a solution comprising 10% sodium mineral and de-ionized water. A current was passed through the circuit and solution in the manner illustrated in FIG. 1. The test panels was exposed for 74 hours under ambient environmental conditions. A visual inspection of the panels indicated that a light-gray colored coating or film was deposited upon the test panel.

In order to ascertain the corrosion protection afforded by the mineral containing coating, the coated panels were tested in accordance with ASTM Procedure No. B117. A section of the panels was covered with tape so that only the coated area was exposed and, thereafter, the taped panels were placed into salt spray. For purposes of comparison, the following panels were also tested in accordance with ASTM Procedure No. B117, 1) Bare Electrogalvanized Panel, and 2) Bare Electrogalvanized Panel soaked for 70 hours in a 10% Sodium Mineral Solution. In addition, bare zinc phosphate coated steel panels(ACT B952, no Parcolene) and bare iron phosphate coated steel panels (ACT B 1000, no Parcolene) were subjected to salt spray for reference.

The results of the ASTM Procedure are listed in the Table below:

| Panel Description | Hours in B117 Salt Spray |
|---|---|
| Zinc phosphate coated steel | 1 |
| Iron phosphate coated steel | 1 |
| Standard Bare Electrogalvanize Panel | ≈120 |
| Standard Panel with Sodium Mineral Soak | ≈120 |
| Coated Cathode of the Invention | 240+ |

The above Table illustrates that the instant invention forms a coating or film which imparts markedly improved corrosion resistance. It is also apparent that the process has resulted in a corrosion protective film that lengthens the life of electrogalvanized metal substrates and surfaces.

ESCA analysis was performed on the zinc surface in accordance with conventional techniques and under the following conditions:

Analytical conditions for ESCA:

| | |
|---|---|
| Instrument | Physical Electronics Model 5701 LSci |
| X-ray source | Monochromatic aluminum |
| Source power | 350 watts |
| Analysis region | 2 mm × 0.8 mm |
| Exit angle* | 50° |
| Electron acceptance angle | ±7° |
| Charge neutralization | electron flood gun |
| Charge correction | C-(C,H) in C 1s spectra at 284.6 eV |

*Exit angle is defined as the angle between the sample plane and the electron analyzer lens.

The silicon photoelectron binding energy was used to characterized the nature of the formed species within the mineralized layer that was formed on the cathode. This species was identified as a zinc disilicate modified by the presence of sodium ion by the binding energy of 102.1 eV for the Si(2p) photoelectron.

EXAMPLE 2

This Example illustrates performing the inventive electrodeposition process at an increased voltage and current in comparison to Example 1.

Prior to the electrodeposition, the cathode panel was subjected to preconditioning process:

1) 2 minute immersion in a 3:1 dilution of Metal Prep 79 (Parker Amchem), 2) two de-ionized rinse, 3) 10 second immersion in a pH 14 sodium hydroxide solution, 4) remove excess solution and allow to air dry, 5) 5 minute immersion in a 50% hydrogen peroxide solution, 6) Blot to remove excess solution and allow to air dry.

A power supply was connected to an electrodeposition cell consisting of a plastic cup containing two standard ACT cold roll steel (clean, unpolished) test panels. One end of the test panel was immersed in a solution consisting of 10% N grade sodium mineral (PQ Corp.) in de-ionized water. The immersed area (1 side) of each panel was approximately 3 inches by 4 inches (12 sq. in.) for a 1:1 anode to cathode ratio. The panels were connected directly to the DC power supply and a voltage of 6 volts was applied for 1 hour. The resulting current ranged from approximately 0.7–1.9 Amperes. The resultant current density ranged from 0.05–0.16 amps/in$^2$.

After the electrolytic process, the coated panel was allowed to dry at ambient conditions and then evaluated for humidity resistance in accordance with ASTM Test No. D2247 by visually monitoring the corrosion activity until development of red corrosion upon 5% of the panel surface area. The coated test panels lasted 25 hours until the first appearance of red corrosion and 120 hours until 5% red corrosion. In comparison, conventional iron and zinc phosphated steel panels develop first corrosion and 5% red corrosion after 7 hours in ASTM D2247 humidity exposure. The above Examples, therefore, illustrate that the inventive process offers an improvement in corrosion resistance over iron and zinc phosphated steel panels.

EXAMPLE 3

Two lead panels were prepared from commercial lead sheathing and cleaned in 6M HCl for 25 minutes. The cleaned lead panels were subsequently placed in a solution comprising 1 wt. % N-grade sodium silicate (supplied by PQ Corporation).

One lead panel was connected to a DC power supply as the anode and the other was a cathode. A potentional of 20 volts was applied initially to produce a current ranging from 0.9 to 1.3 Amperes. After approximately 75 minutes the panels were removed from the sodium silicate solution and rinsed with de-ionized water.

ESCA analysis was performed on the lead surface. The silicon photoelectron binding energy was used to characterized the nature of the formed species within the mineralized layer. This species was identified as a lead disilicate modified by the presence of sodium ion by the binding energy of 102.0 eV for the Si(2p) photoelectron.

EXAMPLE 4

This Example demonstrates forming a mineral surface upon an aluminum substrate. Using the same apparatus in Example 1, aluminum coupons (3"×6") were reacted to form the metal silicate surface. Two different alloys of aluminum were used, Al 2024 and Al7075. Prior to the panels being subjected to the electrolytic process, each panel was prepared using the methods outlined below in Table A. Each panel was washed with reagent alcohol to remove any excessive dirt and oils. The panels were either cleaned with Alumiprep 33, subjected to anodic cleaning or both. Both forms of cleaning are designed to remove excess aluminum oxides. Anodic cleaning was accomplished by placing the working panel as an anode into an aqueous solution containing 5% NaOH, 2.4% $Na_2CO_3$, 2% $Na_2SiO_3$, 0.6% $Na_3PO_4$, and applying a potential to maintain a current density of 100 mA/cm$^2$ across the immersed area of the panel for one minute.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced 2 inches apart from each other. The potential was set to the voltage shown on the table and the cell was run for one hour.

TABLE A

| | Example | | | | | | | |
|---|---|---|---|---|---|---|---|---|
| | A | B | C | D | E | F | G | H |
| Alloy type | 2024 | 2024 | 2024 | 2024 | 7075 | 7075 | 7075 | 7075 |
| Anodic Cleaning | Yes | Yes | No | No | Yes | Yes | No | No |
| Acid Wash | Yes | Yes | Yes | Yes | Yes | Yes | Yes | Yes |
| Bath Solution | | | | | | | | |
| $Na_2SiO_3$ | 1% | 10% | 1% | 10% | 1% | 10% | 1% | 10% |
| $H_2O_2$ | 1% | 0% | 0% | 1% | 1% | 0% | 0% | 1% |
| Potential | 12 V | 18 V | 12 V | 18 V | 12 V | 18 V | 12 V | 18 V |

ESCA was used to analyze the surface of each of the substrates. Every sample measured showed a mixture of silica and metal silicate. Without wishing to be bound by any theory or explanation, it is believed that the metal silicate is a result of the reaction between the metal cations of the surface and the alkali silicates of the coating. It is also believed that the silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 5

This Example illustrates an alternative to immersion for creating the silicate containing medium.

An aqueous gel made by blending 5% sodium silicate and 10% fumed silica was used to coat cold rolled steel panels.

One panel was washed with reagent alcohol, while the other panel was washed in a phosphoric acid based metal prep, followed by a sodium hydroxide wash and a hydrogen peroxide bath. The apparatus was set up using a DC power supply connecting the positive lead to the steel panel and the negative lead to a platinum wire wrapped with glass wool. This setup was designed to simulate a brush plating operation. The "brush" was immersed in the gel solution to allow for complete saturation. The potential was set for 12V and the gel was painted onto the panel with the brush. As the brush passed over the surface of the panel, hydrogen gas evolution could be seen. The gel was brushed on for five minutes and the panel was then washed with de-ionized water to remove any excess gel and unreacted silicates.

ESCA was used to analyze the surface of each steel panel. ESCA detects the reaction products between the metal substrate and the environment created by the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 6

Using the same apparatus described in Example 1, cold rolled steel coupons (ACT laboratories) were reacted to form the metal silicate surface. Prior to the panels being subjected to the electrolytic process, each panel was prepared using the methods outlined below in Table B. Each panel was washed with reagent alcohol to remove any excessive dirt and oils. The panels were either cleaned with Metalprep 79 (Parker Amchem), subjected to anodic cleaning or both. Both forms of cleaning are designed to remove excess metal oxides. Anodic cleaning was accomplished by placing the working panel as an anode into an aqueous solution containing 5% NaOH, 2.4% $Na_2CO_3$, 2% $Na_2SiO_3$, 0.6% $Na_3PO_4$, and applying a potential to maintain a current density of 100 $mA/cm^2$ across the immersed area of the panel for one minute.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced 2 inches apart from each other. The potential was set to the voltage shown on the table and the cell was run for one hour.

TABLE B

| | Example | | | | |
|---|---|---|---|---|---|
| | AA | BB | CC | DD | EE |
| Substrate type | CRS | CRS | CRS | CRS[1] | CRS[2] |
| Anodic Cleaning | No | Yes | No | No | No |
| Acid Wash | Yes | Yes | Yes | No | No |
| Bath Solution | | | | | |
| $Na_2SiO_3$ | 1% | 10% | 1% | — | — |
| Potential (V) | 14-24 | 6 (CV) | 12 V (CV) | — | — |
| Current Density ($mA/cm^2$) | 23 (CC) | 23-10 | 85-48 | — | — |
| B177 | 2 hrs | 1 hr | 1 hr | 0.25 hr | 0.25 hr |

[1]Cold Rolled Steel Control - No treatment was done to this panel.
[2]Cold Rolled Steel with iron phosphate treatment (ACT Laboratories) - No further treatments were performed The electrolytic process was either run as a constant current or constant voltage experiment, designated by the CV or CC symbol in the table. Constant Voltage experiments applied a constant potential to the cell allowing the current to fluctuate while Constant Current experiments held the current by adjusting the potential. Panels were tested for corrosion protection using ASTM B117. Failures were determined at 5% surface coverage of red rust.

ESCA was used to analyze the surface of each of the substrates. ESCA detects the reaction products between the metal substrate and the environment created by the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 7

Using the same apparatus as described in Example 1, zinc galvanized steel coupons (EZG 60G ACT Laboratories) were reacted to form the metal silicate surface. Prior to the panels being subjected to the electrolytic process, each panel was prepared using the methods outlined below in Table C. Each panel was washed with reagent alcohol to remove any excessive dirt and oils.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced approximately 2 inches apart from each other. The potential was set to the voltage shown on the table and the cell was run for one hour.

TABLE C

| | Example | | | |
|---|---|---|---|---|
| | A1 | B2 | C3 | D5 |
| Substrate type | GS | GS | GS | GS[1] |
| Bath Solution | | | | |
| $Na_2SiO_3$ | 10% | 1% | 10% | — |

TABLE C-continued

| | Example | | | |
|---|---|---|---|---|
| | A1 | B2 | C3 | D5 |
| Potential (V) | 6 (CV) | 10 (CV) | 18 (CV) | — |
| Current Density ($mA/cm^2$) | 22-3 | 7-3 | 142-3 | — |
| B177 | 336 hrs | 224 hrs | 216 hrs | 96 hrs |

[1]Galvanized Steel Control-No treatment was done to this panel.

Panels were tested for corrosion protection using ASTM B117. Failures were determined at 5% surface coverage of red rust.

ESCA was used to analyze the surface of each of the substrates. ESCA detects the reaction products between the metal substrate and the environment created by the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and. silica.

EXAMPLE 8

Using the same apparatus as described in Example 1, copper coupons (C110 Hard, Fullerton Metals) were reacted to form the mineralized surface. Prior to the panels being subjected to the electrolytic process, each panel was prepared using the methods outlined below in Table D. Each panel was washed with reagent alcohol to remove any excessive dirt and oils.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced 2 inches apart from each other. The potential was set to the voltage shown on the table and the cell was run for one hour.

TABLE D

| | Example | | | | |
|---|---|---|---|---|---|
| | AA1 | BB2 | CC3 | DD4 | EE5 |
| Substrate type | Cu | Cu | Cu | Cu | Cu[1] |
| Bath Solution | | | | | |
| $Na_2SiO_3$ | 10% | 10% | 1% | 1% | — |
| Potential (V) | 12 (CV) | 6 (CV) | 6 (CV) | 36 (CV) | — |
| Current Density ($mA/cm^2$) | 40-17 | 19-9 | 4-1 | 36-10 | — |
| B117 | 11 hrs | 11 hrs | 5 hrs | 5 hrs | 2 hrs |

[1]Copper Control-No treatment was done to this panel.

Panels were tested for corrosion protection using ASTM B117. Failures were determined by the presence of copper oxide which was indicated by the appearance of a dull haze over the surface.

ESCA was used to analyze the surface of each of the substrates. ESCA allows us to examine the reaction products between the metal substrate and the environment set up from the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 9

An electrochemical cell was set up using a 1 liter beaker. The beaker was filled with a sodium silicate solution comprising 10 wt % N sodium silicate solution (PQ Corp). The temperature of the solution was adjusted by placing the beaker into a water bath to control the temperature. Cold rolled steel coupons (ACT labs, 3×6 inches) were used as anode and cathode materials. The panels are placed into the beaker spaced 1 inch apart facing each other. The working piece was established as the anode. The anode and cathode are connected to a DC power source. The table below shows the voltages, solutions used, time of electrolysis, current density, temperature and corrosion performance.

TABLE E

| Sample # | Silicate Conc. Wt. % | Bath Temp ° C. | Voltage Volts | Current Density $mA/cm^2$ | Bath Time min. | Corrosion Hours (B117) |
|---|---|---|---|---|---|---|
| I-A | 10% | 24 | 12 | 44-48 | 5 | 1 |
| I-B | 10% | 24 | 12 | 49-55 | 5 | 2 |
| I-C | 10% | 37 | 12 | 48-60 | 30 | 71 |
| I-D | 10% | 39 | 12 | 53-68 | 30 | 5 |
| I-F | 10% | 67 | 12 | 68-56 | 60 | 2 |
| I-G | 10% | 64 | 12 | 70-51 | 60 | 75 |
| I-H | NA | NA | NA | NA | NA | 0.5 |

The panels were rinsed with de-ionized water to remove any excess silicates that may have been drawn from the bath solution. The panels underwent corrosion testing according to ASTM B117. The time it took for the panels to reach 5% red rust coverage (as determined by visual observation) in the corrosion chamber was recorded as shown in the above table. Example I-H shows the corrosion results of the same steel panel that did not undergo any treatment.

EXAMPLE 10

Examples 10, 11, and 14 demonstrate one particular aspect of the invention, namely, imparting corrosion resistance to steel shafts that are incorporated within electric motors. The motor shafts were obtained from Emerson Electric Co. from St. Louis, Mo. and are used to hold the rotor assemblies. The shafts measure 25 cm in length and 1.5 cm in diameter and are made from commercially available steel.

An electrochemical cell was set up similar to that in Example 9; except that the cell was arranged to hold the previously described steel motor shaft. The shaft was set up as the cathode while two cold rolled steel panels were used as anodes arranged so that each panel was placed on opposite sides of the shaft. The voltage and temperature were adjusted as shown in the following table. Also shown in the table is the current density of the anodes

TABLE F

| Sample # | Silicate Conc. Wt % | Bath Temp ° C. | Voltage Volts | Current Density mA/cm$^2$ | Bath Time min. | Corrosion Hours |
|---|---|---|---|---|---|---|
| II-A | 10% | 27 | 6 | 17-9 | 60 | 3 |
| II-B | 10% | 60 | 12 | 47-35 | 60 | 7 |
| II-C | 10% | 75 | 12 | 59-45 | 60 | 19 |
| II-D | 10% | 93 | 12 | 99-63 | 60 | 24 |
| II-F | 10% | 96 | 18 | 90-59 | 60 | 24 |
| II-G | NA | NA | NA | NA | NA | 2 |
| II-H | NA | NA | NA | NA | NA | 3 |

The shafts were rinsed with de-ionized water to remove any excess silicates that may have been drawn from the bath solution. Example II-A showed no significant color change compared to Examples II-B-II-F due to the treatment. Example II-B showed a slight yellow/gold tint. Example II-C showed a light blue and slightly pearlescent color. Example II-D and II-F showed a darker blue color due to the treatment. The panels underwent corrosion testing according to ASTM B117. The time it took for the shafts to reach 5% red rust coverage in the corrosion chamber was recorded as shown in the table. Example II-G shows the corrosion results of the same steel shaft that did not undergo any treatment and Example II-H shows the corrosion results of the same steel shaft with a commercial zinc phosphate coating.

EXAMPLE 11

An electrochemical cell was set up similar to that in Example 10 to treat steel shafts. The motor shafts were obtained from Emerson Electric Co. of St. Louis, Mo. and are used to hold the rotor assemblies. The shafts measure 25 cm in length and 1.5 cm in diameter and are made from commercially available steel. The shaft was set up as the cathode while two cold rolled steel panels were used as anodes arranged so that each panel was placed on opposite sides of the shaft. The voltage and temperature were adjusted as shown in the following table. Also shown in the table is the current density of the anodes

TABLE G

| Sample # | Silicate Conc. Wt % | Bath Temp ° C. | Voltage Volts | Current Density mA/cm$^2$ | Bath Time min. | Corrosion Hours |
|---|---|---|---|---|---|---|
| III-A | 10% | 92 | 12 | 90-56 | 60 | 504 |
| III-B | 10% | 73 | 12 | 50-44 | 60 | 552 |
| III-C | NA | NA | NA | NA | NA | 3 |
| III-D | NA | NA | NA | NA | NA | 3 |

The shafts were rinsed with de-ionized water to remove any excess silicates that may have been drawn from the bath solution. The panels underwent corrosion testing according to ASTM D2247. The time it too for the shafts to reach 5% red rust coverage in the corrosion chamber was recorded as shown in the table. Example III-C shows the corrosion results of the same steel shaft that did not undergo any treatment and Example III-D shows the corrosion results of the same steel shaft with a commercial zinc phosphate coating.

EXAMPLE 12

An electrochemical cell was set up using a 1 liter beaker. The solution was filled with sodium silicate solution comprising 5,10, or 15 wt % of N sodium silicate solution (PQ Corporation). The temperature of the solution was adjusted by placing the beaker into a water bath to control the temperature. Cold rolled steel coupons (ACT labs, 3×6 inches) were used as anode and cathode materials. The panels are placed into the beaker spaced 1 inch apart facing each other. The working piece is set up as the anode. The anode and cathode are connected to a DC power source. The table below shows the voltages, solutions used, time of electrolysis, current density through the cathode, temperature, anode to cathode size ratio, and corrosion performance.

TABLE H

| Sample # | Silicate Conc. Wt % | Bath Temp ° C. | Voltage Volts | Current Density mA/cm$^2$ | A/C ratio | Bath Time Min. | Corrosion Hours |
|---|---|---|---|---|---|---|---|
| IV-1 | 5 | 55 | 12 | 49-51 | 0.5 | 15 | 2 |
| IV-2 | 5 | 55 | 18 | 107-90 | 2 | 45 | 1 |
| IV-3 | 5 | 55 | 24 | 111-122 | 1 | 30 | 4 |
| IV-4 | 5 | 75 | 12 | 86-52 | 2 | 45 | 2 |
| IV-5 | 5 | 75 | 18 | 111-112 | 1 | 30 | 3 |
| IV-6 | 5 | 75 | 24 | 140-134 | 0.5 | 15 | 2 |
| IV-7 | 5 | 95 | 12 | 83-49 | 1 | 30 | 1 |
| IV-8 | 5 | 95 | 18 | 129-69 | 0.5 | 15 | 1 |
| IV-9 | 5 | 95 | 24 | 196-120 | 2 | 45 | 4 |
| IV-10 | 10 | 55 | 12 | 101-53 | 2 | 30 | 3 |
| IV-11 | 10 | 55 | 18 | 146-27 | 1 | 15 | 4 |
| IV-12 | 10 | 55 | 24 | 252-186 | 0.5 | 45 | 7 |
| IV-13 | 10 | 75 | 12 | 108-36 | 1 | 15 | 4 |
| IV-14 | 10 | 75 | 18 | 212-163 | 0.5 | 45 | 4 |
| IV-15 | 10 | 75 | 24 | 248-90 | 2 | 30 | 16 |
| IV-16 | 10 | 95 | 12 | 168-161 | 0.5 | 45 | 4 |
| IV-17 | 10 | 95 | 18 | 257-95 | 2 | 30 | 6 |
| IV-18 | 10 | 95 | 24 | 273-75 | 1 | 15 | 4 |
| IV-19 | 15 | 55 | 12 | 140-103 | 1 | 45 | 4 |
| IV-20 | 15 | 55 | 18 | 202-87 | 0.5 | 30 | 4 |
| IV-21 | 15 | 55 | 24 | 215-31 | 2 | 15 | 17 |
| IV-22 | 15 | 75 | 12 | 174-86 | 0.5 | 30 | 17 |
| IV-23 | 15 | 75 | 18 | 192-47 | 2 | 15 | 15 |
| IV-24 | 15 | 75 | 24 | 273-251 | 1 | 45 | 4 |
| IV-25 | 15 | 95 | 12 | 183-75 | 2 | 15 | 8 |
| IV-26 | 15 | 95 | 18 | 273-212 | 1 | 45 | 4 |
| IV-27 | 15 | 95 | 24 | 273-199 | 0.5 | 30 | 15 |
| IV-28 | NA | NA | NA | NA | NA | NA | 0.5 |

The panels were rinsed with de-ionized water to remove any excess silicates that may have been drawn from the bath solution. The panels underwent corrosion testing according to ASTM B117. The time it took for the panels to reach 5% red rust coverage in the corrosion chamber was recorded as shown in the table. Example IV-28 shows the corrosion results of the same steel panel that did not undergo any treatment. The table above shows the that corrosion performance increases with silicate concentration in the bath and elevated temperatures. Corrosion protection can also be achieved within 15 minutes. With a higher current density, the corrosion performance can be enhanced further.

EXAMPLE 13

An electrochemical cell was set up using a 1 liter beaker. The solution was filled with sodium silicate solution comprising 10 wt % N sodium silicate solution (PQ Corporation). The temperature of the solution was adjusted by placing the beaker into a water bath to control the temperature. Zinc galvanized steel coupons (ACT labs, 3×6 inches) were used as cathode materials. Plates of zinc were used as anode material. The panels are placed into the beaker spaced 1 inch apart facing each other. The working piece was set up as the anode. The anode and cathode are connected to a DC power source. The table below shows the voltages, solutions used, time of electrolysis, current density, and corrosion performance.

TABLE I

| Sample # | Silicate Conc. Wt % | Voltage Volts | Current Density $mA/cm^2$ | Bath Time min. | Corrosion (W) Hours | Corrosion (R) Hours |
|---|---|---|---|---|---|---|
| V-A | 10% | 6 | 33-1 | 60 | 16 | 168 |
| V-B | 10% | 3 | 6.5-1 | 60 | 17 | 168 |
| V-C | 10% | 18 | 107-8 | 60 | 22 | 276 |
| V-D | 10% | 24 | 260-7 | 60 | 24 | 276 |
| V-E | NA | NA | NA | NA | 10 | 72 |

The panels were rinsed with de-ionized water to remove any excess silicates that may have been drawn from the bath solution. The panels underwent corrosion testing according to ASTM B117. The time when the panels showed indications of pitting and zinc oxide formation is shown as Corrosion (W). The time it took for the panels to reach 5% red rust coverage in the corrosion chamber was recorded as shown in the table as Corrosion (R). Example V-E shows the corrosion results of the same steel panel that did not undergo any treatment.

EXAMPLE 14

An electrochemical cell was set up similar to that in Examples 10–12 to treat steel shafts. The motor shafts were obtained from Emerson Electric Co. of St. Louis, Mo. and are used to hold the rotor assemblies. The shafts measure 25 cm in length and 1.5 cm in diameter and the alloy information is shown below in the table. The shaft was set up as the cathode while two cold rolled steel panels were used as anodes arranged so that each panel was placed on opposite sides of the shaft. The voltage and temperature were adjusted as shown in the following table. Also shown in the table is the current density of the anodes

TABLE J

| # | Alloy | Silicate Conc. Wt % | Bath Temp ° C. | Voltage Volts | Current Density $mA/cm^2$ | Bath Time min. | Corrosion Hours |
|---|---|---|---|---|---|---|---|
| VI-A | 1018 | 10% | 75 | 12 | 94-66 | 30 | 16 |
| VI-B | 1018 | 10% | 95 | 18 | 136-94 | 30 | 35 |
| VI-C | 1144 | 10% | 75 | 12 | 109-75 | 30 | 9 |
| VI-D | 1144 | 10% | 95 | 18 | 136-102 | 30 | 35 |
| VI-F | 1215 | 10% | 75 | 12 | 92-52 | 30 | 16 |
| VI-G | 1215 | 10% | 95 | 18 | 136-107 | 30 | 40 |

The shafts were rinsed with de-ionized water to remove any excess silicates that may have been drawn from the bath solution. The panels underwent corrosion testing according to ASTM B117. The time it took for the shafts to reach 5% red rust coverage in the corrosion chamber was recorded as shown in the table.

EXAMPLE 15

This Example illustrates using an electrolytic method to form a mineral surface upon steel fibers that can be pressed into a finished article or shaped into a preform that is infiltrated by another material.

Fibers were cut (0.20–0.26 in) from 1070 carbon steel wire, 0.026 in. diameter, cold drawn to 260,000–280,000 PSI. 20 grams of the fibers were placed in a 120 mL plastic beaker. A platinum wire was placed into the beaker making contact with the steel fibers. A steel square 1 in by 1 in, was held 1 inch over the steel fibers, and supported so not to contact the platinum wire. 75 ml of 10% solution of sodium silicate (N-Grade PQ corp) in deionized water was introduced into the beaker thereby immersing both the steel square and the steel fibers and forming an electrolytic cell. A 12 V DC power supply was attached to this cell making the steel fibers the cathode and steel square the anode, and delivered an anodic current density of up to about 3 Amps/sq. inch. The cell was placed onto a Vortex agitator to allow constant movement of the steel fibers. The power supply was turned on and a potential of 12 V passed through the cell for 5 minutes. After this time, the cell was disassembled and the excess solution was poured out, leaving behind only the steel fibers. While being agitated, warm air was blown over the steel particles to allow them to dry.

Salt spray testing in accordance with ASTM B-117 was performed on these fibers. The following table lists the visually determined results of the ASTM B-117 testing.

TABLE K

| Treatment | 1st onset of corrosion | 5% red coverage |
|---|---|---|
| UnCoated | 1 hour | 5 hours |
| Electrolytic | 24 hours | 60 |

EXAMPLES 16–24

The inventive process demonstrated in Examples 16–24 utilized a 1 liter beaker and a DC power supply as described in Example 2. The silicate concentration in the bath, the applied potential and bath temperature have been adjusted and have been designated by table L-A.

TABLE L-A

| Process | silicate conc. | Potential | Temperature | Time |
|---|---|---|---|---|
| A | 1 wt. % | 6 V | 25 C. | 30 min |
| B | 10% | 12 V | 75 C. | 30 min |
| C | 15% | 12 V | 25 C. | 30 min |
| D | 15% | 18 V | 75 C. | 30 min |

EXAMPLE 16

To test the effect of metal ions in the electrolytic solutions, iron chloride was added to the bath solution in concentrations specified in the table below. Introducing iron into the solution was difficult due to its tendency to complex with the silicate or precipitate as iron hydroxide. Additions of iron was also limited due to the acidic nature of the iron cation disrupting the solubility of silica in the alkaline solution. However, it was found that low concentrations of iron chloride (<0.5%) could be added to a 20% N silicate solution in limited quantities for concentrations less that 0.025 wt % FeCl3 in a 10 wt % silicate solution. Table L shows a matrix comparing electrolytic solutions while keeping other conditions constant. Using an inert anode, the effect of the solution without the effect of any anion dissolution were compared.

TABLE L-B

| Process | Silicate conc (%) | Iron Conc (%) | Anode | 1st Red | Failure (5% red) |
|---|---|---|---|---|---|
| B | 10% | 0 | Pt | 2 hrs | 3 hrs |
| B | 10 | 0.0025 | Pt | 2 hrs | 3 hrs |
| B | 10 | 0.025 | Pt | 3 hrs | 7 hrs |
| B | 10 | 0 | Fe | 3 hrs | 7 hrs |
| B | 10 | 0.0025 | Fe | 2 hrs | 4 hrs |
| B | 10 | 0.025 | Fe | 3 hrs | 8 hrs |
| Control | N/A | N/A | N/A | 1 hr | 1 hr |
| Control | N/A | N/A | N/A | 1 hr | 1 hr |

Table L-B Results showing the inventive process at 12V for 30 minutes at 75 C. in a 10% silicate solution. Anodes used are either a platinum net or an iron panel. The solution is a 10% silicate solution with 0–0.0025% iron chloride solution. Corrosion performance is measured in ASTM B117 exposure time.

The trend shows increasing amounts of iron doped into the bath solution using an inert platinum electrode will perform similarly to a bath without doped iron, using an iron anode. This Example demonstrates that the iron being introduced by the steel anode, which provides enhanced corrosion resistance, can be replicated by the introduction of an iron salt solution.

EXAMPLE 17

Without wishing to be bound by any theory or explanation, it is believed that the mineralization reaction mechanism includes a condensation reaction. The presence of a condensation reaction can be illustrated by a rinse study wherein the test panel is rinsed after the electrolytic treatment shown in Table M-A. Table M-A illustrates that corrosion times increase as the time to rinse also increases. It is believed that if the mineral layer inadequately cross-links or polymerizes within the mineral layer the mineral layer can be easily removed in a water rinse. Conversely, as the test panel is dried for a relatively long period of time, the corrosion failure time improves thereby indicating that a fully crossed-linked or polymerized mineral layer was formed. This would further suggest the possibility of a further reaction stage such as the cross-linking reaction.

The corrosion resistance of the mineral layer can be enhanced by heating. Table M-B shows the effect of heating on corrosion performance. The performance begins to decline after about 600 F. Without wishing to be bound by any theory or explanation, it is believed that the heating initially improves cross-linking and continued heating at elevated temperatures caused the cross-linked layer to degrade.

TABLE M-A

| Time of rinse | Failure time |
|---|---|
| Immediately after process- still wet | 1 hour |
| Immediately after panel dries | 2 hour |
| 1 hour after panel dries | 5 hour |
| 24 hours after panel dries | 7 hour |

Table M-A—table showing corrosion failure time (ASTM B117) for steel test panel, treated with the CEM silicate, after being rinsed at different times after treatment.

TABLE M-B

| Process | Heat | Failure |
|---|---|---|
| B | 72 F. | 2 hrs |
| B | 200 F. | 4 hrs |
| B | 300 F. | 4 hrs |
| B | 400 F. | 4 hrs |
| B | 500 F. | 4 hrs |
| B | 600 F. | 4 hrs |
| B | 700 F. | 2 hrs |
| B | 800 F. | 1 hr |
| D | 72 F. | 3 hrs |
| D | 200 F. | 5 hrs |
| D | 300 F. | 6 hrs |
| D | 400 F. | 7 hrs |
| D | 500 F. | 7 hrs |
| D | 600 F. | 7 hrs |
| D | 700 F. | 4 hrs |
| D | 800 F. | 2 hrs |

Table M-B—CEM treatment on steel substrates. Process B refers to a 12V, 30 minute cathodic mineralization treatment in a 10% silicate solution. Process D refers to a 18V, 30 minute, cathodic mineralization treatment in a 15% silicate solution. The failure refers to time to 5% red rust coverage in an ASTM B117 salt spray environment.

EXAMPLE 18

In this Example the binding energy of a mineral layer formed on stainless steel is analyzed. The stainless steel was a ANSI 304 alloy. The samples were solvent washed and treated using Process B (a 10% silicate solution doped with iron chloride, at 75 C. at 12 V for 30 minutes). ESCA was performed on these treated samples in accordance with conventional methods. The ESCA results showed an Si(2p) binding energy at 103.4 eV.

The mineral surface was also analyzed by using Atomic Force Microscope (AFM). The surface revealed crystals were approximately 0.1 to 0.5 μm wide.

EXAMPLE 19

The mineral layer formed in accordance with Example 18—method B was analyzed by using Auger Electron Spectroscopy (AES) in accordance with conventional testing methods. The approximate thickness of the silicate layer was determined to be about 5000 angstroms (500 nm) based upon silicon, metal, and oxygen levels. The silica layer was less than about 500 angstroms (50 nm) based on the levels of metal relative to the amount of silicon and oxygen.

The mineral layer formed in accordance with Example 16 method B applied on a ANSI 304 stainless steel substrate. The mineral layer was analyzed using Atomic Force Microscopy (AFM) in accordance to conventional testing methods. AFM revealed the growth of metal silicate crystals (approximately 0.5 microns) clustered around the areas of the grain boundaries. AFM analysis of mineral layers of steel or zinc substrate did not show this similar growth feature.

EXAMPLE 20

This Example illustrates the affect of silicate concentration on the inventive process. The concentration of the electrolytic solution can be depleted of silicate after performing the inventive process. A 1 liter 10% sodium silicate solution was used in an experiment to test the number of processes a bath could undergo before the reducing the effectiveness of the bath. After 30 uses of the bath, using test panels exposing 15 $in^2$, the corrosion performance of the treated panels decreased significantly.

Exposure of the sodium silicates to acids or metals can gel the silicate rendering it insoluble. If a certain minimum concentration of silicate is available, the addition of an acid or metal salt will precipitate out a gel. If the solution is depleted of silicate, or does not have a sufficient amount, no precipitate should form. A variety of acids and metal salts were added to aliquots of an electrolytic bath. After 40 runs of the inventive process in the same bath, the mineral barrier did not impart the same level of protection. This Example illustrates that iron chloride and zinc chloride can be employed to test the silicate bath for effectiveness.

TABLE N

| Solution | | Run 0 | Run 10 | Run 20 | Run 30 | Run 40 |
|---|---|---|---|---|---|---|
| 0.1% FeCl3 | 2 drops | – | – | – | – | – |
| | 10 drops | + | Trace | Trace | trace | trace |
| | 1 mL | + | + | + | + | trace |
| 10% FeCl3 | 2 drops | + | + | + | + | + |
| | 10 drops | Thick | Thick | Thick | not as thick | not as thick |
| 0.05% ZnSO4 | 2 drops | – | – | – | – | – |
| | 10 drops | – | – | – | – | – |
| 5% ZnSO4 | 2 drops | + | + | + | + | + |
| | 10 drops | + | + | + | + | finer |
| 0.1% ZnCl2 | 2 drops | + | + | + | + | – |
| | 10 drops | + | + | + | + | not as thick |
| 10% ZnCl2 | 2 drops | + | + | + | + | finer |
| | 10 drops | + | + | + | + | + |
| 0.1% HCl | 2 drops | – | – | – | – | – |
| | 10 drops | – | – | – | – | – |
| 10% HCl | 2 drops | – | – | – | – | – |
| | 10 drops | – | – | – | – | – |
| 0.1% K3Fe(CN)6 | 2 drops | – | – | – | – | – |
| | 10 drops | – | – | – | – | – |
| 10% K3Fe(CN)6 | 2 drops | – | – | – | – | – |
| | 10 drops | – | – | – | – | – |

Table N - A 50 ml sample of bath solution was taken every 5th run and tested using a ppt test.
A "–" indicates no precipitation.
a "+" indicates the formation of a precipitate.

EXAMPLE 21

This Example compares the corrosion resistance of a mineral layer formed in accordance with Example 16 on a zinc containing surface in comparison to an iron (steel) containing surface. Table O shows a matrix comparing iron (cold rolled steel—CRS) and zinc (electrogalzanized zinc—EZG) as lattice building materials on a cold rolled steel substrate and an electrozinc galvanized substrate. The results comparing rinsing are also included on Table O. Comparing only the rinsed samples, greater corrosion resistance is obtained by employing differing anode materials. The Process B on steel panels using iron anions provides enhanced resistance to salt spray in comparison to the zinc materials.

TABLE O

| Substrate | Anode | Treatment | Rinse | 1st White | 1st Red | Failure |
|---|---|---|---|---|---|---|
| CRS | Fe | B | None | | 1 | 2 |
| CRS | Fe | B | DI | | 3 | 24 |
| CRS | Zn | B | None | | 1 | 1 |
| CRS | Zn | B | DI | | 2 | 5 |
| EZG | Zn | B | None | 1 | 240 | 582 |

TABLE O-continued

| Substrate | Anode | Treatment | Rinse | 1st White | 1st Red | Failure |
|---|---|---|---|---|---|---|
| EZG | Zn | B | DI | 1 | 312 | 1080 |
| EZG | Fe | B | None | 1 | 312 | 576 |
| EZG | Fe | B | DI | 24 | 312 | 864 |
| CRS | Control | Control | None | | 2 | 2 |
| EZG | Control | Control | None | 3 | 168 | 192 |

Table O- Results showing ASTM B117 corrosion results for cathodic mineralization treated cold rolled steel and electrozinc galvanized steel panels using different anode materials to build the mineral lattice.

EXAMPLE 22

This Example illustrates using a secondary layer upon the mineral layer in order to provide further protection from corrosion (a secondary layer typically comprises compounds that have hydrophilic components which can bind to the mineral layer).

The electronic motor shafts that were mineralized in accordance with Example 10 were contacted with a secondary coating. The two coatings which were used in the shaft coatings were tetra-ethyl-ortho-silicate (TEOS) or an organofunctional silane (VS). The affects of heating the secondary coating are also listed in Table P-A and P-B. Table P-A and P-B show the effect of TEOS and vinyl silanes on the inventive B Process.

TABLE P-A

| Treatment | ED Time | Dry | Rinse | TEOS Dip | 150 C Heat | 1st Red | Failure |
|---|---|---|---|---|---|---|---|
| B | 10 min | None | No | No | no | 3 hrs | 5 hrs |
| B | 10 min | None | No | No | yes | 7 hrs | 10 hrs |
| B | 30 min | None | No | No | no | 3 hrs | 5 hrs |
| B | 30 min | None | No | No | yes | 6 hrs | 11 hrs |

TABLE P-A-continued

| Treat-ment | ED Time | Dry | Rinse | TEOS Dip | 150 C Heat | 1st Red | Failure |
|---|---|---|---|---|---|---|---|
| B | 10 min | Yes | No | Yes | no | 3 hrs | 3 hrs |
| B | 30 min | Yes | No | Yes | yes | 3 hrs | 4 hrs |
| B | 10 min | 1 hr | No | Yes | no | 1 hr | 3 hrs |
| B | 10 min | 1 hr | No | Yes | yes | 7 hrs | 15 hrs |
| B | 10 min | 1 hr | Yes | Yes | no | 5 hrs | 6 hrs |
| B | 10 min | 1 hr | Yes | Yes | yes | 3 hrs | 4 hrs |
| B | 10 min | 1 day | No | Yes | no | 3 hrs | 10 hrs |
| B | 10 min | 1 day | No | Yes | yes | 3 hrs | 17 hrs |
| B | 10 min | 1 day | Yes | Yes | no | 4 hrs | 6 hrs |
| B | 10 min | 1 day | Yes | Yes | yes | 3 hrs | 7 hrs |
| B | 30 min | 1 hr | No | Yes | no | 6 hrs | 13 hrs |
| B | 30 min | 1 hr | No | Yes | yes | 6 hrs | 15 hrs |
| B | 30 min | 1 hr | Yes | Yes | no | 3 hrs | 7 hrs |
| B | 30 min | 1 hr | Yes | Yes | yes | 2 hrs | 6 hrs |
| B | 30 min | 1 day | No | Yes | no | 6 hrs | 10 hrs |
| B | 30 min | 1 day | No | Yes | yes | 6 hrs | 18 hrs |
| B | 30 min | 1 day | Yes | Yes | no | 6 hrs | 6 hrs |
| B | 30 min | 1 day | Yes | Yes | yes | 4 hrs | 7 hrs |
| Control | 0 | 0 | No | No | No | 5 hrs | 5 hrs |
| Control | 0 | 0 | No | No | No | 5 hrs | 5 hrs |

Table P-A—table showing performance effects of TEOS and heat on the B Process.

TABLE P-B

| Treatment | Rinse | Bake | Test | 1st Red | Failure |
|---|---|---|---|---|---|
| B | DI | No | Salt | 3 | 10 |
| B | DI | 150c | Salt | 3 | 6 |
| B | A151 | No | Salt | 4 | 10 |
| B | A151 | 150c | Salt | 2 | 10 |
| B | A186 | No | Salt | 4 | 12 |
| B | A186 | 150c | Salt | 1 | 7 |
| B | A187 | No | Salt | 2 | 16 |
| B | A187 | 150c | Salt | 2 | 16 |
| Control | None | None | Salt | 1 | 1 |

DI = deionized water
A151 = vinyltriethoxysilane (Witco)
A186 = Beta-(3,4-epoxycylcohexyl)-ehtyltrimethoxysilane (Witco)
A187 = Gammaglycidoxypropyl-trimethoxysilane (Witco)
Table P-B- Table showing the effects of vinyl silanes on Elisha B treatment Table P-A illustrates that heat treating improves corrosion resistance. The results also show that the deposition time can be shortened if used in conjunction with the TEOS. TEOS and heat application show a 100% improvement over standard Process B. The use of vinyl silane also is shown to improve the performance of the Process B. One of the added benefits of the organic coating is that it significantly reduces surface energy and repels water.

EXAMPLE 23

This Example illustrates evaluating the inventive process for forming a coating on bare and galvanized steel was evaluated as a possible phosphate replacement for E-coat systems. The evaluation consisted of four categories: applicability of E-coat over the mineral surface; adhesion of the E-coat; corrosion testing of mineral/E-coat systems; and elemental analysis of the mineral coatings. Four mineral coatings (Process A, B, C, D) were evaluated against phosphate controls. The e-coat consisted of a cathodically applied blocked isocyanate epoxy coating.

TABLE Q

| Process | SiO3 conc. | Potential | Temperature | Time |
|---|---|---|---|---|
| A | 1% | 6 V | 25 C. | 30 min |
| B | 10% | 12 V | 75 C. | 30 min |
| C | 15% | 12 V | 25 C. | 30 min |
| D | 15% | 18 V | 75 C. | 30 min |

It was found that E-coat could be uniformly applied to the mineral surfaces formed by processes A–D with the best application occurring on the mineral formed with processes A and B. It was also found that the surfaces A and B had no apparent detrimental effect on the E-coat bath or on the E-coat curing process. The adhesion testing showed that surfaces A, B, and D had improved adhesion of the E-coat to a level comparable with that of phosphate. Similar results were seen in surfaces C and D over galvanized steel. Surfaces B and D generally showed more corrosion resistance than the other variations evaluated.

To understand any relation between the coating and performance, elemental analysis was done. It showed that the depth profile of coatings B and D was significant, >5000 angstroms.

EXAMPLE 24

This Example demonstrates the affects of the inventive process on stress corrosion cracking. These tests were conducted to examine the influence of the inventive electrolytic treatments on the susceptibility of AISI 304 stainless steel coupons to stress cracking. The tests revealed improvement in pitting resistance for samples following the inventive process. Four corrosion coupons of AISI 304 stainless steel were used in the test program. One specimen was tested without surface treatment. Another specimen was tested following an electrolytic treatment of Example 16, method B.

The test specimens were exposed according to ASTM G48 Method A (Ferric Chloride Pitting Test). These tests consisted of exposures to a ferric chloride solution (about 6 percent by weight) at room temperature for a period of 72 hours.

The results of the corrosion tests are given in Table R. The coupon with the electrolytic treatment suffered mainly end grain attack as did the non-treated coupon.

TABLE R

Results of ASTM G48 Pitting Tests

| Max. Pit Depth (mils) | Pit Penetration Rate (mpy) | Comments |
|---|---|---|
| 3.94 | 479 | Largest pits on edges. Smaller pits on surface. |

| ASTM G-48, 304 stainless steel Exposure to Ferric Chloride, 72 Hours, Ambient Temperature | | | | | | | | |
|---|---|---|---|---|---|---|---|---|
| INITIAL WEIGHT (g) | WEIGHT AFTER TEST (g) | WEIGHT AFTER TEST CLEAN (g) | SCALE WEIGHT (g) | WEIGHT LOSS (g)* | SURFACE AREA (sq.in) | TIME (hrs) | DENSITY (g/cc) | CORR. RATE (mpy) |
| 28.7378 | 28.2803 | 28.2702 | −0.4575 | 0.4676 | 4.75 | 72.0 | 7.80 | 93.663 |

EXAMPLE 25

This example illustrates the improved adhesion and corrosion protection of the inventive process as a pretreatment for paint top coats. A mineral layer was formed on a steel panel in accordance to Example 16, process B. The treated panels were immersed in a solution of 5% bis-1,2-(triethoxysilyl) ethane (BSTE-Witco) allowed to dry and then immerse in a 2% solution of vinyltriethoxysilane (Witco) or 2% Gammaglycidoxypropyl-trimethoxysilane (Witco). For purposes of comparison, a steel panel treated only with BSTE followed by vinyl silane, and a zinc phosphate treated steel panel were prepared. All of the panels were powder coated with a thermoset epoxy paint (Corvel 10-1002 by Morton) at a thickness of 2 mils. The panels were scribed using a carbide tip and exposed to ASTM B117 salt spray for 500 hours. After the exposure, the panels were removed and rinsed and allowed to dry for 1 hour. Using a spatula, the scribes were scraped, removing any paint due to undercutting, and the remaining gaps were measured. The zinc phosphate and BSTE treated panels both performed comparably showing an average gap of 23 mm. The mineralized panels with the silane post treatment showed no measurable gap beside the scribe. The mineralized process performed in combination with a silane treatment showed a considerable improvement to the silane treatment alone. This Example demonstrates that the mineral layer provides a surface or layer to which the BSTE layer can better adhere.

EXAMPLE 26

This Example illustrates that the inventive mineral layer formed upon a metal containing surface can function as an electrical insulator. A Miller portable spot welder model #AASW 1510M/110V input/4450 Secondary amp output was used to evaluate insulating properties of a mineral coated steel panel. Control panels of cold rolled steel (CRS), and 60 g galvanized steel were also evaluated. All panels were 0.032" thickness. Weld tips were engaged, and held for an approximately 5.0 second duration. The completed spot welds were examined for bonding, discoloration, and size of weld. The CRS and galvanized panels exhibited a good bond and had a darkened spot weld approximately 0.25" in diameter. The mineral coated steel panel did not conduct an amount of electricity sufficient to generate a weld, and had a slightly discolored 0.06" diameter circle.

EXAMPLE 27

This Example illustrates forming the inventive layer upon a zinc surface obtained by a commercially available sherardization process.

A 2 liter glass beaker was filled with 1900 mL of mineralizing solution comprising 10 wt. % N sodium silicate solution (PQ Corp.) and 0.001 wt. % Ferric Chloride. The solution was heated to 75 C. on a stirring hot plate. A watch glass was placed over the top of the beaker to minimize evaporative loss while the solution was heating up. Two standard ACT cold roll steel (100008) test panels (3 in.×6 in.×0.032 in.) were used as anodes and hung off of copper strip contacts hanging from a 3⁄16 in. diameter copper rod. The cathode was a Sherardized washer that was 1.1875 inches in diameter and 0.125 inches thick with a 0.5 inch center hole. The washer and steel anodes were connected to the power supply via wires with stainless steel gator clips. The power supply was a Hull Cell rectifier (Tri-Electronics). The washer was electrolytically treated for 15 minutes at a constant 2.5 volts (~1 A/sq. inch current density). The washer was allowed to dry at ambient conditions after removal from the CM bath. Subsequent salt spray testing (ASTM-B117 Method) was performed and compared to an untreated control washer with results as follows:

| Sample | Hours to First Red Corrosion | Hours to 5% Red Corrosion |
|---|---|---|
| Control Washer | 144 | 192 |
| Mineralized Washer | 360 | 1416 |

EXAMPLE 28

This Example demonstrates using post-treatment process for improving the properties of the inventive layer.

A tank containing 25 gallons of mineralizing solution comprising 10 wt. % N sodium silicate solution (PQ Corp.) and 0.001 wt. % Ferric Chloride was heated to 75 C. with immersion heaters. Six standard ACT cold roll steel (100008) test panels (3 in.×6 in.×0.032 in.) were used as anodes and hung off of copper strip contacts hanging from a 3⁄16 in. diameter copper rod. The 3⁄16 inch copper rod contacted the 0.5 inch copper anode bus bar which was connected to the rectifier. Three standard ACT Electrogalvanized steel test panels (ACT E60 EZG 2 side 03×06×0.030 inches) were hung between the two sets of three steel anodes with the anodes approximately 3 inches from the electrogalvanized steel test panels. The electrogalvanized steel panels were connected to the cathode bus bar. The Electrogalvanized test panels were treated for 15 minutes at a constant 12 volts. The current was initially approximately 40 amps and decayed to approximately 25 amps after 15 minutes of exposure. The panels were post treated in aqueous solutions as follows:

| Sample # | Immediate Rinse | Dry | Treatment Solution |
|---|---|---|---|
| 1 | No | Yes | Ammonium Zirconyl Carbonate (Bacote 20 Diluted 1:4) |
| 2 | Yes | No | Ammonium Zirconyl Carbonate (Bacote 20 Diluted 1:4) |
| 3 | No | Yes | Ammonium Zirconyl Carbonate (Bacote 20 Diluted 1:4) |
| 4 | No | Yes | 20 Vol % Phosphoric Acid |
| 5 | Yes | No | 20 Vol % Phosphoric Acid |
| 6 | No | Yes | None |
| 7 | No | Yes | 2.5 Vol % Phosphoric Acid |
| 8 | Yes | No | 2.5 Vol % Phosphoric Acid |
| 9 | No | Yes | None |
| 10 | No | Yes | 1.0 wt. % Ferric Chloride |
| 11 | Yes | No | 1.0 wt. % Ferric Chloride |
| 12 | No | Yes | 1.0 wt. % Ferric Chloride |

As indicated above, some of the samples were rinsed and then treated immediately and some of the samples were dried first and then treated with the indicated aqueous solution. After drying, samples 3, 6, 7 and 10 were spray painted with 2 coats of flat black (7776) Premium Rusto-leum Protective Enamel. The final dry film coating thickness averaged 0.00145 inches. The painted test panels were allowed to dry at ambient conditions for 24 hours and then placed in humidity exposure (ASTM-D2247) for 24 hours and then allowed to dry at ambient conditions for 24 hours prior to adhesion testing. The treated panels were subjected to salt spray testing (ASTM-B117) or paint adhesion testing

| Sample # | % Paint Adhesion Loss | Hours To First B117 Red Corrosion | Hours to 5% B117 Red Corrosion |
|---|---|---|---|
| 1 | — | 288 | 456 |
| 2 | — | 168 | 216 |
| 3 | 0 | — | — |
| 4 | — | 144 | 216 |
| 5 | — | 96 | 120 |
| 6 | 100 | — | — |
| 7 | 15–35 | — | — |
| 8 | — | 72 | 96 |
| 9 | — | 192 | 288 |
| 10 | 15–35 | — | — |
| 11 | — | 168 | 168 |
| 12 | — | 72 | 96 |

The above results show that the ammonium zirconyl carbonate had a beneficial effect on noth adhesion of subsequent coatings as well as an improvement in corrosion resistance of uncoated surfaces. The salt spray results indicate that the corrosion resistance was decreased by immediate rinsing and exposure to the strong phosphoric acid.

EXAMPLE 29

This Example demonstrates the affects of the inventive process on stress corrosion cracking. These tests were conducted to examine the influence of the inventive electrolytic treatments on the susceptibility of AISI 304 and 316 stainless steel coupons to stress cracking. The tests revealed improvement in pitting resistance for samples following the inventive process. Three corrosion coupons steel were included in each test group. The Mineralized specimen were tested following an electrolytic treatment of Example 16, method B (15 minutes).

The test specimens were exposed according to ASTM G48 Method A (Ferric Chloride Pitting Test). These tests consisted of exposures to a ferric chloride solution (about 6 percent by weight) at room temperature for a period of 72 hours.

The results of the corrosion tests are given in Table R. The coupon with the electrolytic treatment suffered mainly end grain attack as did the non-treated coupon. The results are as follows:

| Material | Mineral Treatment | Avg. Max. Pit Depth (μM) | Avg. Of Ten Deepest Pits (μM) | Pit Density (pits/sq. cm) | Avg. Mass Loss (g/sq. cm) |
|---|---|---|---|---|---|
| AISI 304 | No | 2847 | 1310 | 4.1 | 0.034 |
| AISI 304 | Yes | 2950 | 1503 | 0.2 | 0.020 |
| AISI 316L | No | 2083 | 1049 | 2.5 | 0.013 |
| AISI 316L | Yes | 2720 | 760 | 0.3 | 0.005 |

The mineralizing treatment of the instant invention effectively reduced the number of pits that occurred.

EXAMPLE 30

This Example demonstrates the effectiveness of the inventive method on improving the crack resistance of the underlying substrate. Nine U-Bend Stress corrosion specimens made from AISI 304 stainless steel were subjected to a heat sensitization treatment at 1200 F. for 8 hours prior to applying the mineral treatment as described in Example 16, method B (5 and 15 minutes). Each test group contained three samples that were 8 inches long, two inches wide and 1/16 inches thick. After application of the mineral treatment, the samples were placed over a stainless steel pipe section and stressed. The exposure sequence was similar to that described in ASTM C692 and consisted of applying foam gas thermal insulation around the U-Bemd Specimens that conformed to their shape. One assembled, 2.473 g/L NaCl solution was continuously introduced to the tension surface of the specimens through holes in the insulation. The flow rate was regulated to achieve partial wet/dry conditions on the specimens. The pipe section was internally heated using a cartridge heater and a heat transfer fluid and test temperature controlled at 160 F. The test was run for a period of 100 hours followed by a visual examination of the test specimens with results as follows:

| Material | Mineral Treatment | Mineral Treatment Time (Minutes) | AVG. Number Of Cracks | Avg. Total Crack Length (In) |
|---|---|---|---|---|
| AISI 304 | No | 0 | 8.7 | 1.373 |
| AISI 304 | Yes | 5 | 2.7 | 0.516 |
| AISI 304 | Yes | 15 | 4.3 | 1.330 |

The mineralization treatment of the instant invention effectively reduced the number and length of cracks that occurred

EXAMPLE 31

This Example illustrates the improved heat and corrosion resistance of zinc plated parking brake conduit end fitting sleeves treated in accordance with the instant invention in comparison to conventional chromate treatments.

HEAT EXPOSURE HOURS AND CORROSION RESISTANCE (ASTM B-117 SALT SPRAY EXPOSURE)

| | | AMBIENT (70 F) | | | 200 F/15 MINUTES | | | 400 F/15 MINUTES | | | 600 F/15 MINUTES | | | 700 F/15 MINUTES | | |
|---|---|---|---|---|---|---|---|---|---|---|---|---|---|---|---|---|
| | | First White | First Red | Failed Red | First White | First Red | Failed Red | First White | First Red | Failed Red | First White | First Red | Failed Red | First White | First Red | Failed Red |
| Zinc Plated Control | Average | 24 | 136 | 212 | 24 | 204 | 276 | 24 | 123 | 187 | 24 | 119 | 204 | 24 | 60 | 162 |
| CM* Zinc No Rinse | Average | 72 | 520 | 1128 | 72 | 620 | 1148 | 72 | 340 | 464 | 72 | 220 | 448 | 48 | 99 | 264 |
| CM* Zinc Process A (Silane) | Average | 72 | 736 | 1216 | 72 | 716 | 1320 | 72 | 295 | 1084 | 72 | 271 | 448 | 48 | 83 | 247 |
| Zinc Clear Chromate | Average | 48 | 128 | 239 | 48 | 127 | 262 | 24 | 84 | 181 | 24 | 84 | 153 | 24 | 52 | 278 |
| Zinc Yellow Chromate | Average | 420 | 1652 | 2200 | 424 | 1360 | 1712 | 48 | 202 | 364 | 24 | 93 | 168 | 24 | 24 | 170 |
| Zinc Olive Drab Chromate | Average | 312 | 1804 | 2336 | 294 | 1868 | 2644 | 48 | 331 | 576 | 36 | 97 | 168 | 24 | 76 | 236 |

*treated cathodically in accordance with the instant invention + Each Value Above Represents the Average of 6 Individual Samples Cylinderical zinc plated conduit end-fitting sleeves measuring about 1.5 in length by about 0.50 inch diameter were divided into six groups. One group was given no subsequent surface treatment. One group was treated with a commercially available clear chromate conversion coating, one group was treated with a yellow chromate conversion and one group was treated with an olive-drab chromate conversion coating. Two groups were charged cathodically in a bath comprising de-ionized water and about 10 wt % N sodium silicate solution at 12.0 volts (70–80° C.) for 15 minutes. One of the cathodically charged groups was dried with no further treatment. The other group was rinsed successively in deionized water, a solution comprising 10 wt % denatured ethanol in deionized water with 2 vol. % 1, 2 (Bis Triethoxysilyllethane [supplied commercially by Aldrich], and a solution comprising 10 wt % denatured ethanol in deionized water with 2 vol. % epoxy silane [supplied commercially as Silquest A-186 by OSF Specialties].

The six groups of fitting were each subdivided and exposed to either (A) no elevated temp. (B) 200° F. for 15 min. (C) 400° F. for 15 min. (D) 600° F. for 15 min. or (E) 700° F. for 15 minutes and tested in salt spray for ASTM-B117 until failure. Results are given above.

EXAMPLE 32

This Example illustrates a process comprising the inventive process that is followed by a post-treatment. The post-treatment comprises contacting a previously treated article with an aqueous medium comprising water soluble or dispersible compounds.

The inventive process was conducted in an electrolyte that was prepared by adding 349.98 g of N. sodium silicate solution to a process tank containing 2.8 L of deionized water. The solution was mixed for 5–10 minutes. 0.1021 g of ferric chloride was mixed into 352.33 g of deionized water. Then the two solutions, the sodium silicate and ferric chloride, were combined in the processing tank with stirring. An amount of deionized water was added to the tank to make the final volume of the solution 3.5 L. ACT zinc (egalv) panels were immersed in the electrolyte as the cathode for a period of about 15 minutes. The anode comprised platinum clad niobium mesh.

The following post-treatment mediums were prepared by adding the indicated amount of compound to de-ionized water:

A) Zirconium Acetate (200 g/L)
B) Zirconium Oxy Chloride (100 g/L)
C) Calcium Fluoride (8.75 g/L)
D) Aluminum Nitrate (200 g/L)
E) Magnesium Sulfate (100 g/L)
F) Tin (11) Fluoride (12 g/L)
G) Zinc Sulfate (100 g/L)
H) Titanium Fluoride (5 g/L)
I) Zirconium Fluoride (5 g/L)
J) Titanium Chloride (150 g/L)
K) Stannic Chloride (20 g/L)

The corrosion resistance of the post-treated zinc panels was tested in accordance with ASTM B-177. The results of the testing are listed below.

| | Hrs. First White | Hrs. First Red | Failed |
|---|---|---|---|
| Zicronium Acetate Zn | 5 | 96 | 96 |
| Zicronium Oxzychlorite Zn | 5 | 120 | 120 |
| Calcium Flouride Zn | 24 | 96 | 96 |
| Aluminum Nitrate Zn | 24 | 144 | 240 |
| Magnesium Sulfate Zn | 24 | 264 | 456 |
| Tin Fluoride Zn | 24 | 288 | 312 |
| Zinc Sulfate Zn | 5 | 96 | 96 |
| Titanium Fluoride Zn | 24 | 72 | 72 |
| Zirconium Fluoride Zn | 24 | 144 | 264 |

EXAMPLES 33

This Example illustrates the addition of dopants to the electrolyte (or bath) that is employed for operating the inventive process. In each following example, the workpiece comprises the cathode and the anode comprises platinum clad niobium mesh. The electrolyte was prepared in accordance with the method Example 32 and the indicated amount of dopant was added. An ACT test panel comprising zinc, iron or 304 stainless steel was immersed in the electrolyte and the indicated current was introduced.

| | Panel | | | | | |
|---|---|---|---|---|---|---|
| Minutes | Zn Current (A) | Zn Current (A) | Fe Current (A) | Fe Current (A) | 30455 Current (A) | 30455 Current (A) |
| | | Dopant (Zirconium Acetate Bath, 200/L) | | | | |
| 0 | 13.1 | 13.3 | 12.9 | 12.4 | 12.0 | 11.8 |
| 15 | 13.2 | 13.0 | 12.1 | 11.6 | 11.1 | 11.1 |
| Bath Temp | 74–76 C | 74–76 | 74–76 | 74–76 | 74–76 | 74–76 |
| | | Dopant (Zirconium Oxy Chloride Bath, 100 g/l) | | | | |
| 0 | 11.2 | 11.2 | 11.3 | 11.1 | 10.5 | 11.2 |
| 15 | 10.9 | 10.5 | 10.3 | 10.1 | 10.0 | 10.6 |
| Bath Temp | 74–76 C | 74–76 | 74–76 | 74–76 | 74–76 | 74–76 |
| | | Dopant (Calcium Fluoride Bath, 8.75 g/L) | | | | |
| 0 | 11.2 | 11.0 | 11.0 | 10.7 | 9.2 | 12.1 |
| 15 | 11.0 | 10.8 | 10.4 | 9.7 | 9.0 | 11.5 |
| Bath Temp | 74–76 C | 74–76 | 74–76 | 74–76 | 74–76 | 74–76 |
| | | Dopant (Aluminum Nitrate Bath, 200 g/L) | | | | |
| 0 | 12 | 12.9 | 12.5 | 12.2 | 11.8 | 11.4 |
| 15 | 13.3 | 12.7 | 12 | 11.7 | 11.1 | 11 |
| Bath Temp | 74–76 C | 74–76 | 74–76 | 74–76 | 74–76 | 74–76 |
| | | Dopant (Magnesium Sulfate Bath, 100 g/L) | | | | |
| 0 | 11.1 | 10.6 | 10.2 | 10.8 | 11.3 | 11.8 |
| 15 | 10.5 | 9.9 | 9.9 | 10.5 | 10.6 | 10.9 |
| Bath Temp | 74–76 C | 74–76 | 74–76 | 74–76 | 74–76 | 74–76 |
| | | Dopant (Tin Flouride Bath, 12 grams/1L) | | | | |
| 0 | 11 | 12.1 | 11.6 | 11.3 | 10.5 | 10.7 |
| 15 | 11.1 | 11.4 | 10.8 | 10 | 9.4 | 9.4 |
| Bath Temp | 74–76 C | 74–76 | 74–76 | 74–76 | 74–76 | 74–76 |
| | | Dopant (Zinc Sulflate Bath, 100 g/L) | | | | |
| 0 | 11.3 | 10.9 | 9.9 | 9.3 | 8.5 | 9.3 |
| 15 | 10.1 | 9.7 | 8.9 | 8.3 | 7.9 | 8 |
| Bath Temp | 74–76 C | 74–76 | 74–76 | 74–76 | 74–76 | 74–76 |
| | | Dopant (Titanium Flouride Bath, 5 g/L) | | | | |
| 0 | 12 | 12.8 | 12.1 | 13.3 | 12.9 | 12.7 |
| 15 | 12.4 | 12.4 | 11.6 | 12.9 | 12.1 | 11.8 |
| Bath Temp | 74–76 C | 74–76 | 74–76 | 74–76 | 74–76 | 74–76 |
| | | Dopant (Zirconium Flouride Bath, 5 g/L) | | | | |
| 0 | 11.3 | 11.9 | 12.1 | 12.1 | 11.7 | 11.4 |
| 15 | 11.8 | 11.7 | 11.5 | 11.3 | 10.8 | 10.7 |
| BathTemp | 74–76 C | 74–76 | 74–76 | 74–76 | 74–76 | 74–76 |
| | | Dopant (Titanium (III) Chloride Bath, 150 g/L) | | | | |
| 0 | 11.0 | 8.8 | 9.3 | 10.0 | 10.2 | 10.2 |
| 15 | 9.4 | 8.0 | 8.6 | 9.3 | 8.9 | 8.4 |
| Bath Temp | 74–76 C | 74–76 | 74–76 | 74–76 | 74–76 | 74–76 |
| | | Dopant (Stannic Chloride Bath, 20 g/1L) | | | | |
| 0 | 10.7 | 10.2 | 9.5 | 9.7 | 9.6 | 9.3 |
| 15 | 9.3 | 9.1 | 8.8 | 8.6 | 8.3 | 7.9 |
| Bath Temp | 74–76 C | 74–76 | 74–76 | 74–76 | 74–76 | 74–76 |

EXAMPLE 34

This Example illustrates activating a mineralized surface with an acidic rinse prior to application of a sealer (e.g., Enthone® Sealer). Zinc plated low carbon steel cylindrical screw machined conduit end fitting sleeves measuring about 1.23 inch in length and about ⅝ inch in diameter were stripped to remove the zinc plating, then replated and mineralized in a laboratory-sized plating barrel. The mineralized sleeves were immersion post-treated in either citric (Group A) or nitric acid (Group B) and a commercially available sealer (Enthone® C-23) was applied. After 24 hours, the sealed sleeves were subjected to ASTM-B117 salt spray exposure testing. Group A was exposed to ASTM B-117 for about 144 hours until white rust was observed whereas Group B was exposed for about 120 hours prior to the onset of white rust.

The mineralization was performed in a laboratory size processing line using the following parameters:

Tank Capacity: 25 gallons
Orientation: Sterling 6×12 inch mini-barrel
Anode: Platinum plated niobium mesh
Work Area 736 square inches
Work Type: Zinc plated conduit end-fitting sleeves
Work Quantity: 184 pieces
Run Time: 15 minutes
Run Voltage: 12.0 Volts
Resultant Current: AVG 28 Amps
Run Temperature: 78–79.5° C.
Electrolyte Solution: Deionized Water, 10 wt. % Silicate solution with iron dopant
Power Supply: Aldonex model T-224-7.5 CR-CCV The mineralization process post-Treatment was performed by immersion in a 20 wt % solution of Bacote® 20 ammonium zirconyl carbonate for 5 seconds followed by a 30 second spin dry in a New Holland Model K-11 spin dry with a 15 second forward cycle and a 15 second reverse cycle at ambient temperature. The following Tables list the Time and Temperature for each step of the process performed in this Example.

| Group A | | |
|---|---|---|
| Process Step | Time (min.) | Temp (° C.) |
| Strip zinc in 15 vol. % HCl | 5 min. | 20° C. |
| Deionized water rinse | 5 sec. | 20° C. |
| Deionized water rinse | 5 sec. | 20° C. |
| Alkaline Zinc Plate (~90 A) | 20 min. | 20° C. |
| Stagnant H20 rinse | 30 sec. | 20° C. |
| Deionized water rinse | 30 sec. | 20° C. |
| Mineralization ~28A (12 V.) | 15 min. | 78–79.5° C. |
| Spin dry (2) | 60 sec. | Amb. |
| B Post-Treat Bacote(R) 20 | 5 sec. | 20° C. |
| Spin dry | 30 sec. | Amb. |
| Activate w/ .25% Nitric Acid | 5 sec. | 20° C. |
| Spin dry | 30 sec. | Amb. |
| Seal Enthone(R) C-23 | 90 sec. | 55° C. |
| Spin dry | 30 sec. | Amb. |
| Oven cure | 10 min. | 80° C. |

| Group B | | |
|---|---|---|
| Process Step | Time (min.) | Temp (° C.) |
| Strip zinc in 15 vol. % HCl | 5 min. | 20° C. |
| Deionized water rinse | 5 sec. | 20° C. |
| Deionized water rinse | 5 sec. | 20° C. |
| Alkaline Zinc Plate (~90 A) | 20 min. | 20° C. |
| Stagnant H20 rinse | 30 sec. | 20° C. |
| Deionized water rinse | 30 sec. | 20° C. |
| Mineralization ~28 A (12 V.) | 15 min. | 78–79.5° C. |
| Spin dry (2) | 60 sec. | Amb. |
| Bacote(R) 20 Post-Treat | 5 sec. | 20° C. |
| Spin dry | 30 sec. | Amb. |
| Activate w/ 5 wt. % Citric Acid | 30 sec. | 20° C. |
| Spin dry | 30 sec. | Amb. |
| Seal Enthone(R) C-23 | 90 sec. | 55° C. |
| Spin dry | 30 sec. | Amb. |
| Oven cure | 10 min. | 80° C. |

EXAMPLE 35

This Example illustrates operating the inventive process wherein the anode comprises a nickel mesh. The cathode comprised ACT electrogalvanized panels.

An electrolyte was prepared by combining 349.98 g of N. sodium silicate solution, 0.1021 g of $FeCl_3$, and enough distilled water to bring the total volume of the solution to 3.5 L. The zinc panels were each run for fifteen minutes and set out to dry without rinsing. Before each run and after the panels had completely dried, the zinc panels were weighed to determine weight gain experienced by the cathode during the electrochemical process. The nickel mesh anodes were also weighed at the start of the experiment, after 10 runs, after 20 runs, and after 23 runs. This allows the weight gain of the anodes to be calculated. The voltage was set at 12.0V for all of the runs.

The data for each of the 23 runs completed can be found in the Table below. The data below illustrates that the current and voltage passing between the electrodes stayed stable over all of the runs.

TABLE

Multiple Runs using Nickel Mesh Anodes and Zinc Cathodes In Sodium Silicate Electrolyte

| | Current (A) | | Multimeter (V) | | Weight Change Cathode |
|---|---|---|---|---|---|
| Run # | Start | Finish | Start | Finish | (g) |
| 1 | 12.7 | 13.9 | 8.40 | 6.88 | 0.014 |
| 2 | 13.5 | 13.3 | 10.32 | 10.15 | 0.037 |
| 3 | 13.1 | 13.2 | 10.58 | 10.14 | 0.032 |
| 4 | 12.6 | 12.8 | 10.30 | 9.91 | 0.016 |
| 5 | 12.7 | 13.2 | 10.04 | 10.04 | 0.016 |
| 6 | 13.5 | 14.0 | 9.68 | 9.63 | 0.037 |
| 7 | 13.3 | 13.8 | 9.03 | 9.72 | 0.038 |
| 8 | 13.4 | 13.7 | 9.38 | 9.44 | 0.035 |
| 9 | 13.3 | 13.6 | 9.76 | 8.96 | 0.038 |
| 10 | 9.0 | 9.2 | 10.45 | 10.34 | 0.035 |
| 11 | 11.0 | 11.7 | 10.06 | 9.96 | 0.027 |

TABLE-continued

Multiple Runs using Nickel Mesh Anodes and Zinc Cathodes In Sodium Silicate Electrolyte

| Run # | Current (A) Start | Current (A) Finish | Multimeter (V) Start | Multimeter (V) Finish | Weight Change Cathode (g) |
|---|---|---|---|---|---|
| 12 | 10.8 | 11.8 | 9.97 | 9.60 | 0.033 |
| 13 | 11.2 | 11.9 | 10.13 | 9.87 | 0.014 |
| 14 | 11.7 | 12.0 | 9.96 | 10.09 | 0.029 |
| 15 | 11.4 | 12.0 | 9.60 | 9.44 | 0.030 |
| 16 | 11.7 | 12.1 | 10.15 | 9.94 | 0.030 |
| 17 | 12.1 | 12.4 | 9.82 | 10.10 | 0.028 |
| 18 | 12.1 | 12.4 | 10.33 | 10.26 | 0.031 |
| 19 | 11.7 | 12.2 | 10.77 | 10.28 | 0.030 |
| 20 | 11.9 | 12.3 | 10.37 | 10.16 | 0.029 |
| 21 | 8.4 | 9.4 | 8.85 | 9.10 | 0.002 |
| 22 | 9.7 | 9.9 | 10.53 | 10.57 | 0.022 |
| 23 | 9.4 | 10.0 | 10.39 | 10.52 | 0.022 |

Examples 36A–36C illustrate employing the inventive process to treat components and assemblies used to fabricate electric motors.

EXAMPLE 36A

This Example illustrates using the inventive process to treat an assembled article comprising an electric motor laminate stack.

A 2.75 inch diameter×0.40 inch thick electric motor laminate stack comprising 13 individual laminates mechanically coined together and comprised high silicon steel alloy was treated for 15 minutes at 80 C. and 12 volts of direct current (9–10 Amperes; 9.75 amperes average). The treatment was performed in a tank containing 25 gallons of mineralizing solution comprising 10 wt % N sodium silicate (PQ Corp.) and 0.001 wt. % Ferric Chloride. A dimensionally stable platinum coated niobium mesh anode was used and the laminate stack was connected cathodically by suspending it by a copper hook inserted through the center hole of the laminate stack. After completing the treatment, the excess solution was removed by subjecting the laminate stack to a 30 second forward and a 30 second reverse spin cycle in a lab size 6 inch basket New Holland Spin Dryer at ambient temperature. The laminate stack was subsequently immersed for 5 seconds in a solution comprising 2 volume % of Bis(triethoxysilyl)ethane (CAS#16068-37-4 from Gelest, Inc.) and 98 vol. % of a solution of ethyl alcohol (10 wt. %) and deionized water (90 wt. %) and then spun as previously indicated to remove the excess solution. The laminate stack was then immersed in a second silane solution prepared similarly to the first except containing Beta-(3,4-epoxycyclohexyl)ethyltrimethoxysilane (CAS #3388-04-3 from Gelest, Inc.). After spinning off the excess solution and drying at ambient temperatures for 1 hour, the laminate stack was coated with a metal particulate filled epoxy topcoat (B18-Magni Industries) by dipping to obtain full coverage, allowing the excess to drip off, and then spinning in the New Holland spin dryer as described above. The coating was cured in a laboratory convection oven at 90 C. for 10 minutes and then at 205 C. for 20 minutes. The laminate stack was then evaluated for corrosion resistance by subjecting it to salt fog exposure via the ASTM-B117 Method for a total of 500 hours. At 168 hours of exposure less than 5% of the surface had any red corrosion products present. At 500 hours of exposure 25% of the surface had red corrosion present primarily from corrosion at edges and from the interior of the laminate stack, no loss of coating adhesion was evident.

EXAMPLE 36B

This Example illustrates using the surface formed by the inventive process to reduce molten metal adhesion.

A Single 2.75 inch diameter motor core laminate comprising high silicon steel was treated for 15 minutes at 75–77 C. and 12 volts of direct current (4.8–10.7 Amperes; 6.4 amperes average). The treatment was performed in a beaker containing 1.8 liters comprising mineralizing solution comprising 10 wt % N sodium silicate (PQ Corp.) and 0.001 wt. % Ferric Chloride. Two steel anodes (Standard 3×6 Cold Roll Steel Coupons, ACT Laboratories) were used and the clean laminate was connected cathodically by suspending the laminate from a stainless steel gator clip fastened onto copper wire and connected to the edge of the laminate. After completion of the treatment, the excess solution was removed by subjecting the laminate to a 30 second forward and a 30 second reverse spin cycle in a lab size 6 inch basket New Holland Spin Dryer at ambient temperature. The laminate was subsequently immersed for 5 seconds in a solution comprising 2 volume % of Bis(triethoxysilyl)ethane (CAS#16068-37-4 from Gelest, Inc.) and 98 vol. % of a solution of ethyl alcohol (10 wt. %) and deionized water (90 wt. %) and then spun as previously indicated to remove the excess solution. The laminate was then immersed in a second silane solution prepared similarly to the first except containing Beta-(3,4-epoxycyclohexyl)ethyltrimethoxysilane (CAS #3388-04-3 from Gelest, Inc.). After spinning off the excess solution and drying at ambient temperatures for 1 hour, the laminate was coated with a metal particulate filled high temperature topcoat system (B68/B70-Magni Industries) by dipping to obtain full coverage, allowing the excess to drip off, and then spinning in the New Holland spin dryer as described above. The coating was cured in a laboratory convection oven at 90 C. for 10 minutes and then at 288 C. for 30 minutes. The laminate was then evaluated for resistance to contact with molten aluminum. Aluminum alloy (Alcanal 801737) was melted in a melt pot of about 1500°. The topcoated laminate was dipped momentarily half-way into the molten aluminum and then removed at which time the it was observed that no aluminum stuck to the laminate. The dip was repeated for a 5 second period after which it was observed the aluminum had covered the edge of the laminate and filled the laminate slots along the immersed edge. After letting the laminate cool it was observed that the aluminum coating could be manually peeled from the edge of the laminate and that the laminate topcoating had not been compromised. This application demonstrates that the invention can be used to form a barrier between the steel laminate and the molten aluminum.

EXAMPLE 36C

This Example demonstrates using the inventive process to partially treat an assembled article.

The edge of a 2.75 inch diameter×6 inch long motor laminate core assembly comprising individual laminates (high silicon steel alloy) mechanically coined together and assembled onto a simulated shaft was treated for 15 minutes at 75–80 C. and 12 volts of direct current (6–7 Amperes; 6.75 amperes average). The treatment was performed in a tank containing 25 gallons of mineralizing solution comprising 10 wt % N sodium silicate (PQ Corp.) and 0.001 wt.

% Ferric Chloride. A dimensionally stable platinum coated niobium mesh anode was used. The assembly was manually rotated on cathodically connected bus bars and positioned so that only one side of the outer 0.5 inch of the core was in solution and being mineralized while the assembly was being rotated. After completion of the treatment, the excess solution was removed by subjecting the laminate stack to a 30 second forward and a 30 second reverse spin cycle in a lab size 6 inch basket New Holland Spin Dryer at ambient temperature. The exterior surface of the core (mineralized area) was visually distinct from center of the core as viewed from the ends of the assembly.

EXAMPLE 37

This Example illustrates using the inventive process to form a flexible, adherent and corrosion resistant surface upon rivets.

An 18 inch diameter by 36 inch long plating barrel was loaded with 150 pounds of rivets previously plated with 0.2–0.3 mil zinc plating. Each rivet had a 0.75 inch diameter head, a 0.25 inch diameter shaft, and an overall length of 1.05 inches. The rivets were subjected to the mineralizing treatment in 180 gallons of solution in a rectangular tank at a temperature of 75 C. for 30 minutes. The temperature was maintained with an external flow through Chromalox Heater (NWHIS-18-075P-E4XX). Direct Current was supplied at 12 volts by an Aldonex Ultimatic DC Power Supply (Model T-412-20CFR-COV) and ranged from 102–126 Amperes (113 Amperes Average). The barrel was connected cathodically and the anode was constructed from a dimensionally stable platinum coated niobium mesh configured in the tank in a parabolic shape such that the barrel is partially encircled by the anode on the sides and the bottom. After completion of the mineralizing treatment, the barrel is rotated out of solution for 30 seconds to allow excess solution to drain and then rotated in a deionized water rinse for 30 seconds and again allowed to drain while rotating out of solution. The rivets were then dumped from the barrel into standard commercial size dip-spin baskets and excess solution was spun off in a New Holland K-90 spin dryer utilizing a 30 second forward cycle and a 30 second reverse cycle. The rivets were subsequently immersed for 5 seconds in a solution comprising 2 volume % of Bis(triethoxysilyl)ethane (CAS#16068-37-4 from Gelest, Inc.) and 98 vol. % of a solution of ethyl alcohol (10 wt. %) and deionized water (90 wt. %) and then spun as previously indicated to remove the excess solution. The rivets were then immersed in a second silane solution prepared similarly to the first except containing Beta-(3,4-epoxycyclohexyl)ethyltrimethoxysilane (CAS #3388-04-3 from Gelest, Inc.). The excess solution was spun off and the rivets were dried at 49–54 C. for 5 minutes while spinning. Subsequently the rivets were coated with a metal particulate filled Epoxy Topcoat (B17-Magni Industries) by dip-spin technique in a Ronci dip-spin machine. The coating was cured in a commercial belt oven consisting of exposure zones of 90 C. for 10 minutes and 205 C. for 20 minutes. The rivets (with and without B17 topcoat) were then evaluated for corrosion resistance by exposure to salt fog via the ASTM-B117 Method. The results are as follows:

| | | |
|---|---|---|
| Zinc Plated Rivets Only: | Avg Hrs to First Red = 124 | Avg Hrs to 5% Red = 288 |
| Rivets w/mineral & silane: | Avg Hrs to First Red = 416 | Avg Hrs to 5% Red = 728 |
| Rivets w/mineral, silane, B17 coat: | Avg Hrs to First Red = 1184 | Avg Hrs to 5% Red = 1336 |

EXAMPLE 38

This Example illustrates the adhesion characteristics of Dorriform® E (A31), and Dorritech® Silver (B17) over Zinc Plated panels with a mineralized surface of the instant invention. The mineralization process was performed by hanging each 4"×12" panel between two rectangular dimensionally stable platinum coated niobium anodes in 25 gallons of solution described in Example 28. The mineralization was achieved in 15 minutes at 70 to 80 C. and 12V of direct current. The current ranged from 22–35 Amperes (27 Amp average). Dorriform and Dorritech are commercially available heat cured epoxy topcoatings. The inventive mineralized surface was post treated by being rinsed with silane in accordance with Example 36 with the exception that ambient air drying while hanging statically was utilized instead of the New Holland spin dryer.

Adhesion testing was performed at three dome heights (0.150, 0.200, 0.300 inch) on a Timius Olsen machine and graded per General Motors GM6190M. A crosshatch adhesion rating per General Motors GM907P was also conducted. Testing procedures GM6190M and GM907P are hereby incorporated by reference. The adhesion was tested by applying and removing standard 3M 610 tape.

One 4×12-inch panel of each coating was coated with the epoxy coatings and then heat cured. These samples were then domed at 0.150, 0.200, and 0.300 of an inch and tested for adhesion ratings per GM6190M. The samples were all so crosshatched and graded per GM9071P values recorded.

The adhesion ratings tested per GM9071P Tape Adhesion for Paint Finishes, show no paint removed with either coating system pretreatment. This test represents the results for a film that receives no forming or bending.

The panels that received a draw in the form of domes were rated per GM6190M, which gives Photographic Standards of paint loss, for the Olsen cupping machine. This adhesion test is a much more severe test than the GM9071P Tape Adhesion for Paint Finishes. Based on these ratings the inventive mineralization process with a silane rinse increases adhesion and satisfies the above identified specifications.

EXAMPLE 39

This Example demonstrates the flexibility, corrosion resistance and secondary process tolerance of the surface formed in accordance with the inventive process.

A laboratory size Sterling 6 inch diameter by 12 inch long plating barrel was loaded with 200 parking brake cable conduit end-fitting sleeves previously plated with 0.2–0.3 mil zinc plating. Each cylindrical sleeve measures about 1.5 inches in length and about 0.5 inches in diameter and has a surface area of approximately 4.0 square inches. The sleeves were subjected to the mineralizing treatment in 25 gallons of solution in a rectangular tank at a temperature of 75 C. for 15 minutes. Direct Current was supplied at 12 volts by an Aldonex DC Power Supply and ranged from 20–32 Amperes (24 Amperes Average). The barrel was connected cathodically and a dimensionally stable platinum coated niobium mesh anode was used. After completion of the mineralizing treatment, the barrel was rotated out of solution for 30 seconds to allow excess solution to drain and then dumped from the barrel into a 6 inch lab sized New Holland spin dryer and excess solution was spun off in a utilizing a 30 second forward cycle and a 30 second reverse cycle. Half of the sleeves were subsequently immersed for 5 seconds in a solution comprised of 2 volume % of Bis(triethoxysilyl) ethane (CAS#16068-37-4 from Gelest, Inc.) and 98 vol. % of a solution of ethyl alcohol (10 wt. %) and deionized water (90 wt. %) and then spun as previously indicated to remove the excess solution. The sleeves were then immersed in a second silane solution prepared similarly to the first except containing Beta-(3,4-epoxycyclohexyl) ethyltrimethoxysilane (CAS #3388-04-3 from Gelest, Inc.). The excess solution was spun off and the sleeves were dried at ambient temperature for 5 minutes while spinning. The other half of the sleeves were immersed for 5 seconds in a solution of 20 Wt % Bacote 20 (Magnesium Elektron), a solution containing ammonium zirconyl carbonate; and then spin dried as previously indicated. Subsequently the sleeves of each of the two groups above were divided into 2 subgroups and each subgroup was coated with one of the following topcoats (A) a clear, substantially waterborne Epoxy Topcoat (W86-Magni Industries); and (B) a clear, substantially waterborne Polyurethane topcoat containing 80.5 wt. % Neorez R9637 (Zeneca Resins), 6.5 Wt % N Sodium Silicate (PQ Corp.), and 13.0 Wt. % deionized water. The coatings were applied via a dip-spin utilizing the New Holland spin dry machine indicated previously. The W86 coating was cured in laboratory convection ovens at 90 C. for 10 minutes and then 177 C. for 30 min. The Polyurethane coating was cured in laboratory convection ovens at 60 C. for 10 minutes and then 125 C. for 30 minutes. In addition, comparative groups of sleeves having had the silane rinses disclosed above were prepared as indicated above but were also crimped onto conduit to evaluate the ability of the coating system to tolerate manufacturing processes. Two additional coatings were also tested in the crimped condition: (C) a metal particulate filled Epoxy Topcoat (B18-Magni Industries); (D) a metal particulate filled Epoxy Topcoat (B17-Magni Industries); The B18 and B17 coatings were cured in laboratory convection ovens at 90 C. for 10 minutes and then 205 C. for 20 minutes. The sleeves (crimped and unclamped) were evaluated for corrosion resistance by exposure to salt fog via the ASTM-B117 Method.

The results of the salt fog ASTM-B117 testing are:

| | | | |
|---|---|---|---|
| 1) Mineral + W86 Unclamped: (Silanes) | Avg First White = 312 | Avg First Red = 1584 | Avg 5% Red = 2112 |
| 2) Mineral + W86 Unclamped: (Bacote 20) | Avg First White = 312 | Avg First Red = 1244 | Avg 5% Red = 1744 |
| 3) Mineral + W86 Crimped: (Silanes) | Avg First White = 280 | Avg First Red > 408 | Avg 5% Red > 408 |
| 4) Mineral + PU Unclamped: (Silanes) | Avg First White = 312 | Avg First Red = 1456 | Avg 5% Red = 1596 |
| 5) Mineral + PU Unclamped: (Bacote 20) | Avg First White = 320 | Avg First Red = 1460 | Avg 5% Red = 1652 |
| 6) Mineral + PU crimped: | Avg First White = 320 | Avg First Red > 408 | Avg 5% Red > 408 |
| 7) Mineral + B17 Crimped: | Avg First White > 408 | Avg First Red > 408 | Avg 5% Red > 408 |
| 8) Mineral + B18 crimped: | Avg First White > 408 | Avg First Red > 408 | Avg 5% Red > 408 |

EXAMPLE 40

This Example demonstrates the flexibility, corrosion resistance and secondary process tolerance of the surface formed in accordance with the inventive process when topcoated with a heat cured epoxy.

A laboratory size Sterling 6 inch diameter by 12 inch long plating barrel was loaded with 15 pounds of rivets previously plated with 0.2–0.3 mil zinc plating. Each rivet had a 0.75 inch diameter head, a 0.25 inch diameter shaft, and an overall length of 1.05 inches. The rivets were subjected to the mineralizing treatment in 25 gallons of solution in a rectangular tank at a temperature of 70–75 C. for 15 minutes. Direct Current was supplied at 12 volts by an Aldonex DC Power Supply and ranged from 22–28 Amperes (24 Amperes Average). The barrel was connected cathodically and two standard 4 inch×12 inch cold roll steel coupons (ACT Laboratories) were used as anodes and were positioned on both sides of the tank. After completion of the mineralizing treatment, the barrel was rotated out of solution for 30 seconds to allow excess solution to drain and then rotated in a deionized water rinse for 30 seconds and again allowed to drain while rotating out of solution. The rivets were then dumped from the barrel into standard commercial size dip-spin baskets and excess solution was spun off in a 6 inch lab sized New Holland spin dryer utilizing a 30 second forward cycle and a 30 second reverse cycle. The rivets were subsequently immersed for 5 seconds in a solution comprising 2 volume % of Bis(triethoxysilyl)ethane (Aldrich Chemical Co.) and 98 vol. % of a solution of ethyl alcohol (10 wt. %) and deionized water (90 wt. %) and then spun as previously indicated to remove the excess solution. The rivets were then immersed in a second silane solution prepared similarly to the first except containing Beta-(3,4-epoxycyclohexyl) ethyltrimethoxysilane (Silquest A-186, OSI Specialties). The excess solution was spun off and the rivets were dried at ambient temperature for 5 minutes while spinning. Subsequently the rivets were coated with a metal particulate filled Epoxy Topcoat (B17-Magni Industries) by dip-spin technique in a Ronci dip-spin machine. The coating was cured in a commercial belt oven consisting of exposure zones of 90 C. for 10 minutes and 205 C. for 20 minutes. A comparison group of rivets was also prepared from the same group of zinc plated rivets but were given a yellow hexavalent chromate conversion coating instead of the mineral coating and then likewise coated with Magni B17. The rivets were then mounted in pressboard blocks as both staked and unstaked samples. The rivets were evaluated for corrosion resistance by exposure to salt fog via the ASTM-B117 Method. The results are as follows: (Hours Of Exposure)

| | | | |
|---|---|---|---|
| Mineral + B17 Unstaked: | Avg First White > 3240 | Avg First Red > 4736 | Avg 5% Red > 5400 |
| Mineral + B17 Staked: | Avg First White = 1680 | Avg First Red > 5400 | Avg 5% Red > 5400 |
| Chromate + B17 Unstaked: | Avg First White = 928 | Avg First Red = 2360 | Avg 5% Red = 2856 |
| Chromate + B17 Staked: | Avg First White = 72 | Avg First Red = 888 | Avg 5% Red = 1651 |

The above results indicate the mineral treatment provides a superior performance to hexavalent chromate in conjunction with the B17 topcoat and also has significantly better damage tolerance as is revealed by the staked performance.

EXAMPLE 41

This Example illustrates applying a fluoropolymer containing topcoating upon a mineralized surface. The following five types of components were subjected to the mineralizing treatment in 25 gallons of solution in a rectangular tank at a temperature of 70–75 C. for 15 minutes via a Sterling 6 inch diameter by 12 inches long, rotating mini-barrel.

A. 4.25 Inch Long ⅝ Inch Dia. Zinc Plated B7 Alloy Studs (19 Pieces)

B. ⅝ Inch Dia. Zinc Plated 2H Nuts (40 pieces)

C. 60 mm Long M10 Partially Threaded Zinc Plated 10.9 Grade Cap Screws

D. 2.25 In. Long ⅜ In. Dia. Fully Threaded Zinc Plated Grade 8 Hex Flange Head Cap Screws E. 2.25 In. Long ⅜ In. Dia. Partial Threaded Zinc Plated Grade 8 Hex Flange Head Cap Screws Groups C, D, and E were treated in one run and groups A & B were treated in a separate run. Direct Current was supplied at 12 volts by an Aldonex DC Power Supply and ranged from 25–30 Amperes (27 Amperes Average) for the run with Groups C, D, & E. The run with Groups A & B ranged from 23–32 Amperes (27 Amperes Average). The barrel was connected cathodically and a dimensionally stable platinum coated niobium mesh anode was used for the run with Groups A & B. Six standard cold roll steel 4 inch×12 inch steel coupons (ACT Laboratories) were used for the anodes with the run containing groups C, D, & E. After completion of the mineralizing treatment, the barrel was rotated out of solution for 30 seconds to allow excess solution to drain and then dumped from the barrel into a 6 inch lab sized New Holland spin dryer and excess solution was spun off in a utilizing a 30 second forward cycle and a 30 second reverse cycle. The components were subsequently immersed for 5 seconds in a solution comprising 2 volume % of Bis(triethoxysilyl)ethane (CAS#16068-37-4 from Gelest, Inc.) and 98 vol. % of a solution of ethyl alcohol (10 wt. %) and deionized water (90 wt. %) and then spun as previously indicated to remove the excess solution. The components were then immersed in a second silane solution prepared similarly to the first except containing Beta-(3,4-epoxycyclohexyl) ethyltrimethoxysilane (CAS #3388-04-3 from Gelest, Inc.). The excess solution was spun off and the components were dried at ambient temperature for 5 minutes while spinning.

The ⅝ in. dia. Zinc plated studs were mineralized and rinsed with the aforementioned silane solutions and coated with a fluoropolymer topcoating (Xylan® supplied by Whitford). All cap screws received two coats of Xylan 1424/524 topcoats (Viscosity: 49 sec. #2 Zahn, 72° F.) and one group of capscrews additionally received a primer layer of metal filled epoxy (Magni B06J: Viscosity: 49 sec. #2 Zahn, 72° F.) beneath the Xylan topcoats. Two coats of Xylan were required to obtain a uniform color. A standard nut encountered no binding on the coated cap screws. The salt spray results are listed below.

| Sample Type | Hours To First White Corrosion | Hours To First Red Corrosion | Hours To 5% Red Corrosion |
|---|---|---|---|
| XYLAN 1424/524 OVER ZINC PLATE + Mineral & Silane | | | |
| C | 240 | 624 | 1272 |
| E | 144 | 936 | 1752 |
| D | 528 | 1440 | 2064 |
| D | 168 | 1272 | 2520 |
| E | 144 | 1104 | 2064 |
| E | 336 | 1272 | 2064 |
| AVERAGE: | 260 | 1108 | 1956 |
| XYLAN 1424/524 OVER ZINC PLATE + Mineral, Silane & Magni B06J Primer | | | |
| E | 624 | 3456 | 5376 |
| E | 480 | 3048 | 4728 |
| E | 480 | 3936 | >5616 |
| D | 144 | 3456 | >5616 |
| D | 144 | 1368 | 4008 |
| D | 480 | 2520 | 4536 |
| AVERAGE: | 392 | 2964 | >4980 |
| *Test Discontinued at 5616 Hours Of Salt Spray Exposure | | | |
| XYLAN OVER ZINC PLATED (STUDS WITH NUTS) + Mineral & Silane | | | |
| AB | 144** | 1056 | 3072 |
| AB | 144** | 1056 | >4008 |
| AB | 48** | 1176 | 3072 |
| AB | 288** | 1824 | >4008 |
| AB | 288** | 2712 | >4008 |
| AB | 360** | 2928 | >4008 |
| AVERAGE: | 212** | 1792 | >3696 |

*Test discontinued at 4008 Hours Of Salt Spray Exposure
**White on the nuts at edges between surfaces

The invention claimed is:

1. A method for treating a substrate having an electrically conductive surface comprising:

contacting at least a portion of the surface with a medium comprising water and at least one silicate, introducing a current to said medium wherein said surface is employed as a cathode under conditions and form a time sufficient to form a film comprising silica upon the surface; and recovering the substrate.

2. The method of claim 1 wherein the silicate containing medium comprises sodium silicate.

3. The method of claim 1 wherein the surface comprises at least one member selected from the group consisting of copper, nickel, tin, iron, zinc, aluminum, magnesium, stainless steel and steel and alloys thereof.

4. The method of claim 1 wherein further comprising a post-treatment comprising contacting the surface with a second medium comprising a combination comprising water and at least one water soluble compound selected from the group consisting of chlorides, fluorides, nitrates, zirconates, titanates, sulphates and water soluble lithium compounds.

5. The method of claim 1 further comprising a post-treatment comprising contacting with a medium comprising at least one of silanes and silica.

6. The method of claim 4 wherein said water soluble compound comprises at least one member selected from the group consisting of from the group of titanium chloride, tin chloride, zirconium acetate, zirconium oxychloride, calcium fluoride, tin fluoride, titanium fluoride, zirconium fluoride; ammonium fluorosilicate, aluminum nitrate; magnesium sulphate, sodium sulphate, zinc sulphate, copper sulphate; lithium acetate, lithium bicarbonate, lithium citrate, lithium metaborate, lithium vanadate and lithium tungstate.

7. The method of claim 1 further comprising a post-treatment comprising contacting with at least one member selected from the group consisting of nitric acid, citric acid, and ammonium dibasic group.

8. A method for treating a metallic or an electrically conductive surface comprising:

exposing at least a portion of the surface to a medium comprising at least one polar carrier and at least one silicate that is soluble within said carrier wherein said medium has a basic pH and is substantially free of chromates, introducing an energy source into said medium, wherein the surface is employed as a cathode;

recovering the surface from the medium wherein the treated surface comprises a first film comprising at least one silicate and a second film upon the first film comprising silica.

9. The method of claim 8 wherein the medium comprises greater than 3 wt. % of at least one silicate.

10. The method of claim 8 wherein said medium comprises an anode that comprises platinum or nickel.

11. The method of claim wherein the silicate containing medium further comprises at least on dopant.

12. The method of claim 11 wherein the dopant comprises at least one member selected from the group consisting of molybdenum, chromium, titanium, zirconium, vanadium, phosphorus, aluminum, iron, boron, bismuth, gallium, tellurium, germanium, antimony, niobium, magnesium, manganese, and their oxides and salts.

13. The method of claim 11 wherein the dopant is provided by the anode of the electrolytic environment.

14. The method of claim 8 further comprising contacting said surface with at least one member selected from the group consisting of nitric acid, citric acid and ammonium dibasic citrate subsequent to said recovering.

15. The method of claim 8 further comprising applying a coating composition comprising at least one member chosen from the group of latex, silanes, epoxies, silicone, amines, alkyds, urethanes and acrylics.

16. A method for treating a substrate having an electrically conductive surface comprising:

establishing an electrolytic environment within a medium comprising water and at least one silicate wherein said medium is substantially free of chromates, contacting at least a portion of the surface with the medium, wherein said surface is employed as a cathode, under conditions and form a time sufficient to form a film comprising silica upon the surface; and recovering the substrate.

17. The method of claim 16 wherein the medium has a basic pH and comprises water, sodium silicate and silica.

18. The method of claim 16 further comprising anodically cleaning the surface prior to said contacting.

19. The method of claim 16 wherein the medium is substantially free of heavy metals.

20. The method of claim 16 further comprising applying at least one coating upon the recovered substrate.

21. The method of claim 20 wherein the coating comprises at least one member selected from the group consisting of silanes, epoxies, latexes, acrylics, titanates and zirconates.

22. The method of claim 16 further comprising rinsing the recovered substrate.

* * * * *